United States Patent
Torikoshi

(10) Patent No.: US 7,439,701 B2
(45) Date of Patent: Oct. 21, 2008

(54) METHOD AND DEVICE FOR DETECTING INITIAL EXCITATION PHASE OF STEPPING MOTOR

(75) Inventor: Akihiko Torikoshi, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 155 days.

(21) Appl. No.: 11/474,512

(22) Filed: Jun. 26, 2006

(65) Prior Publication Data
US 2007/0296370 A1 Dec. 27, 2007

(51) Int. Cl.
*G05B 19/40* (2006.01)
(52) U.S. Cl. .................. 318/685; 318/696; 318/432
(58) Field of Classification Search ............. 318/685, 318/696, 254, 138, 439, 432, 700, 434, 280
See application file for complete search history.

(56) References Cited

U.S. PATENT DOCUMENTS 6,806,625 B2 * 10/2004 Ogawa et al. ............... 310/358
2002/0180282 A1 * 12/2002 Suzuki et al. ............. 310/49 R
2006/0049791 A1 3/2006 Larsson ..................... 318/685

FOREIGN PATENT DOCUMENTS

| DE | 38 32 258 A1 | 3/1990 |
| DE | 102 25 610 A1 | 1/2004 |
| JP | H8-322293 | 12/1996 |
| JP | 2001/298993 | 10/2001 |

* cited by examiner

*Primary Examiner*—Karen Masih
(74) *Attorney, Agent, or Firm*—Kratz, Quintos & Hanson, LLP

(57) ABSTRACT

A method and device for detecting an initial excitation phase of a stepping motor is provided, by which an initial excitation phase of a rotor corresponding to a position of a stopper can be detected with a unit of a stepping angle of a microstep drive which is smaller than that of a full step drive without using elements such as magnetoelectric elements. Upon appropriately changing an excitation phase of a stepping motor, on the basis of a generated pattern of an induced electromotive force in an exciting coil in a non-excitation state upon a full step drive, whether or not a pointer comes in contact with a stopper to stop a reverse rotation of the pointer and rotor is judged so that it is specified on which excitation phase the pointer and rotor are reversed, thereby detecting an initial excitation phase of the rotor corresponding to a position of the stopper.

4 Claims, 12 Drawing Sheets

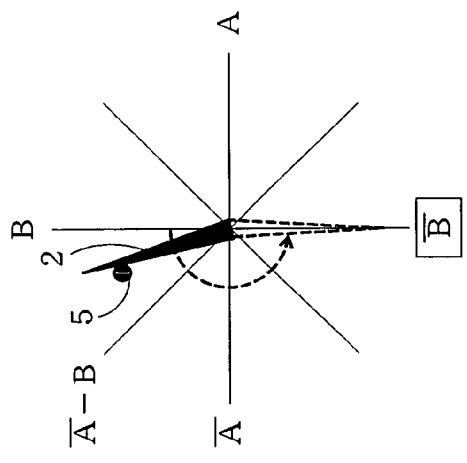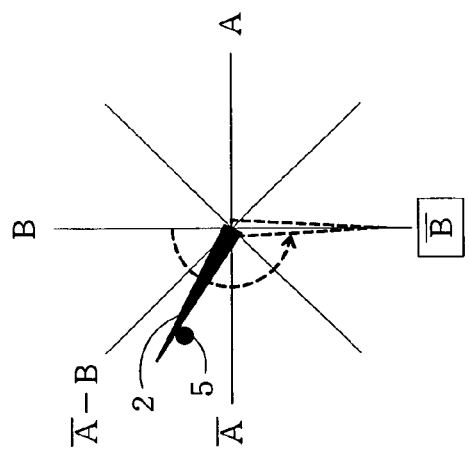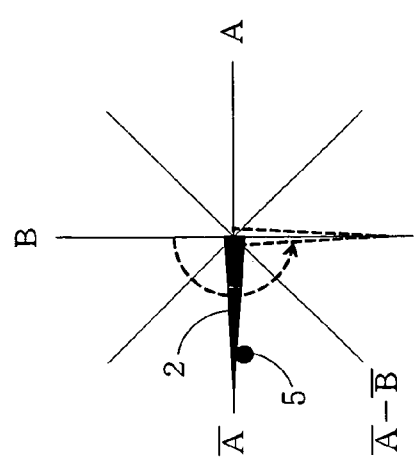
FIG. 6A  FIG. 6B  FIG. 6C
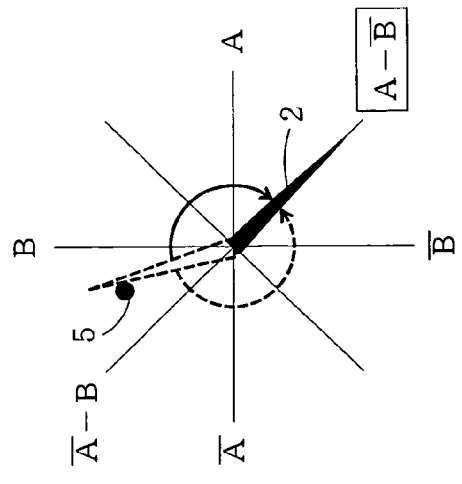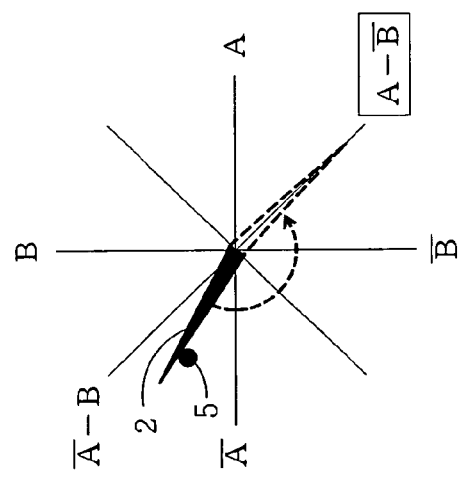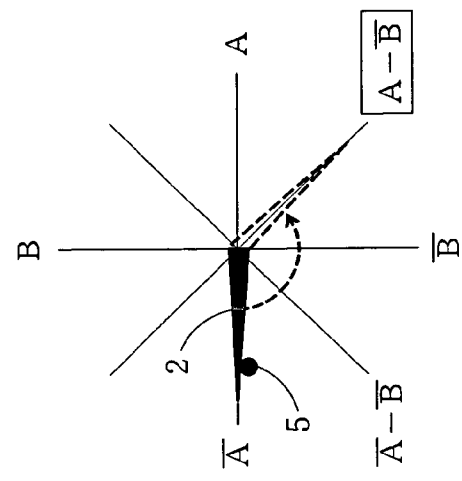
FIG. 7A  FIG. 7B  FIG. 7C

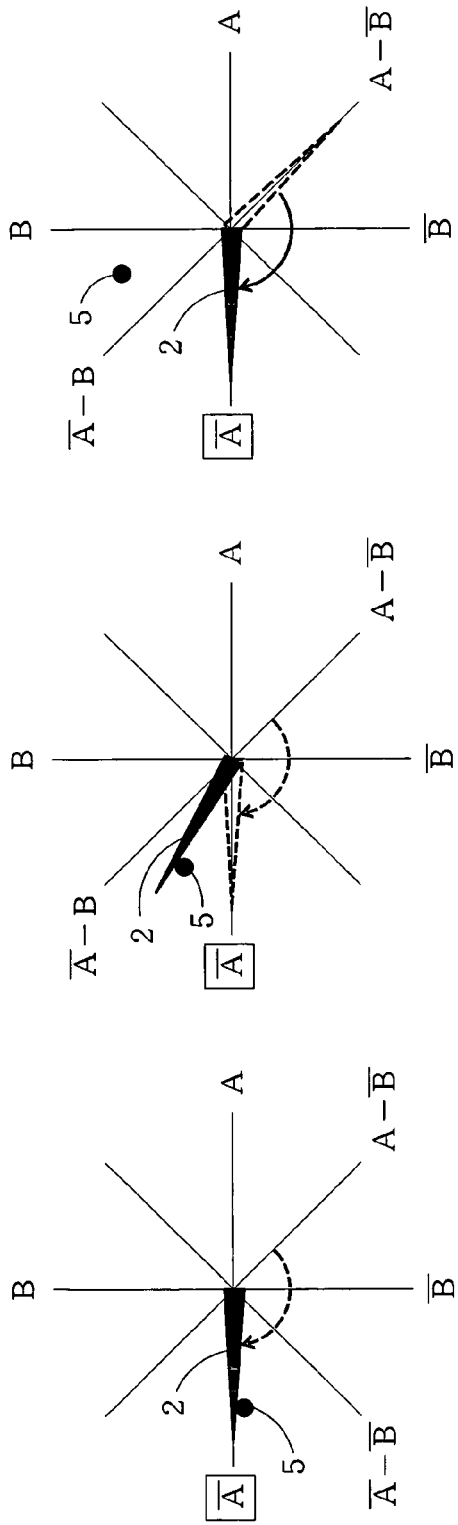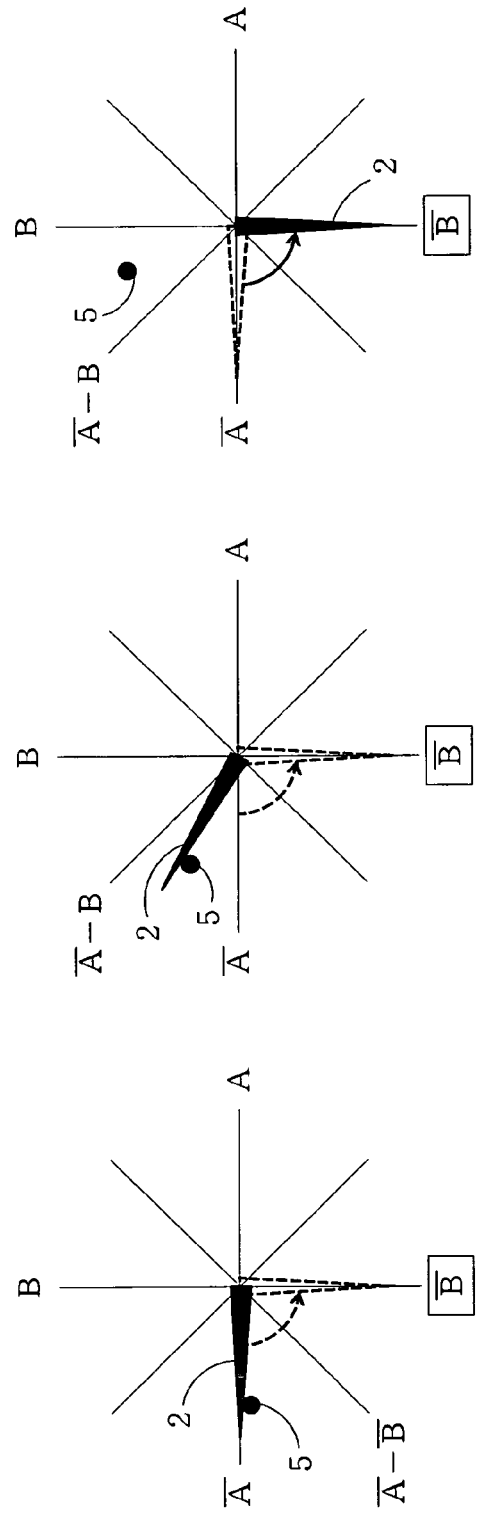

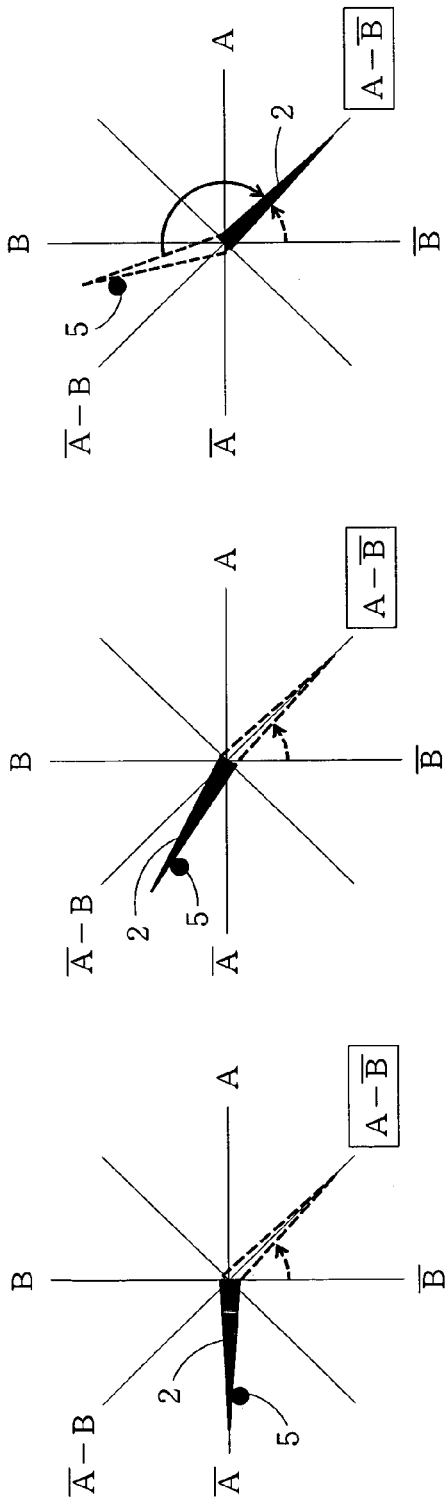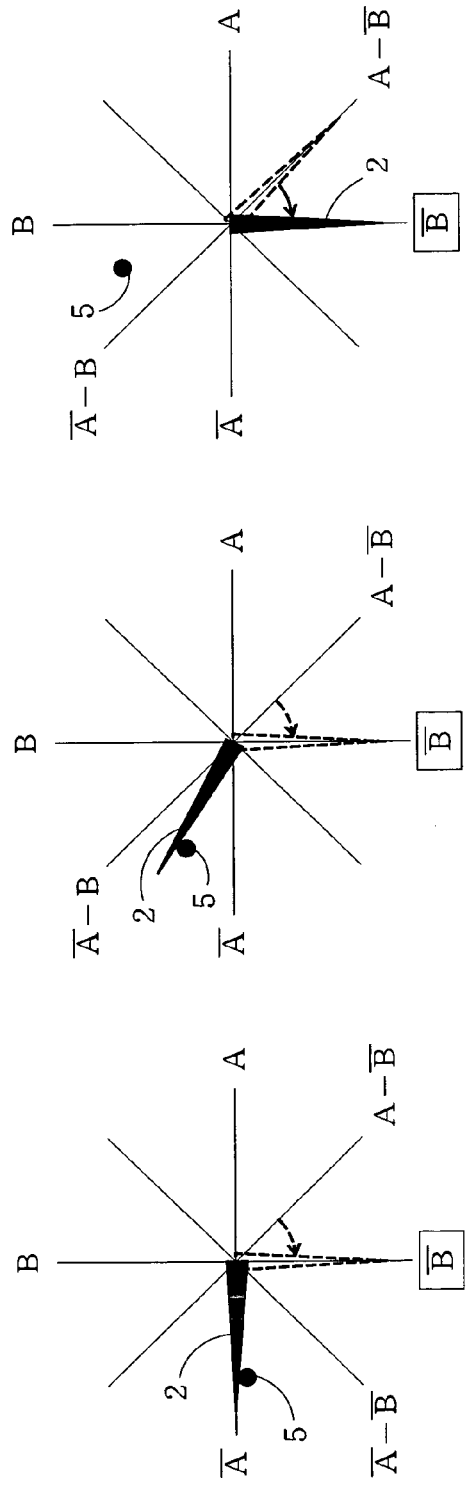

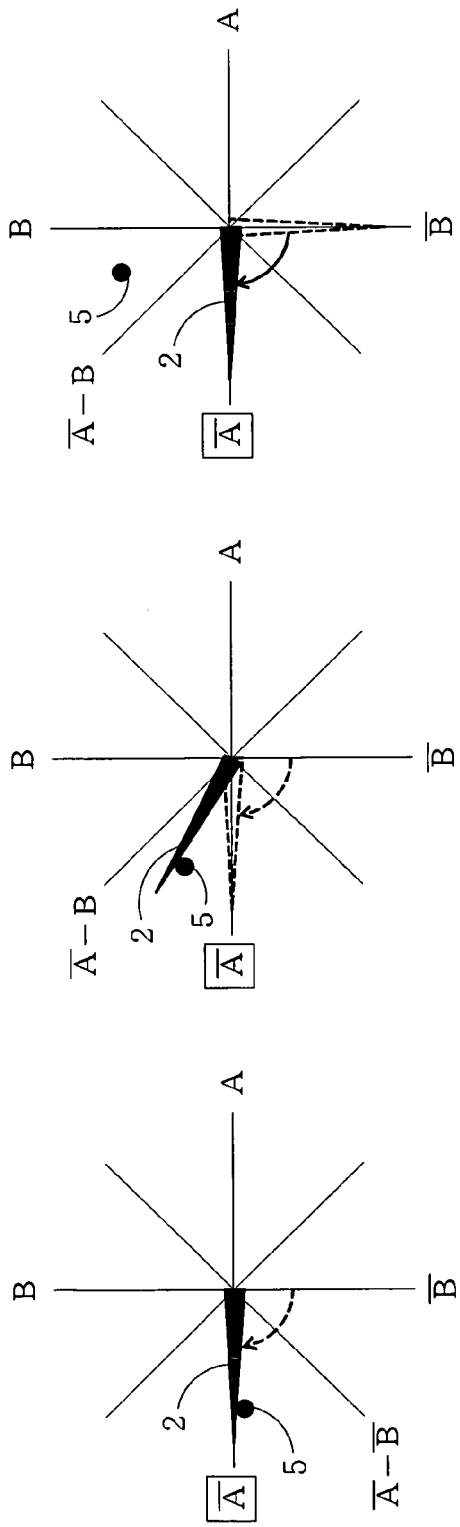
FIG. 20A
FIG. 20B
FIG. 20C
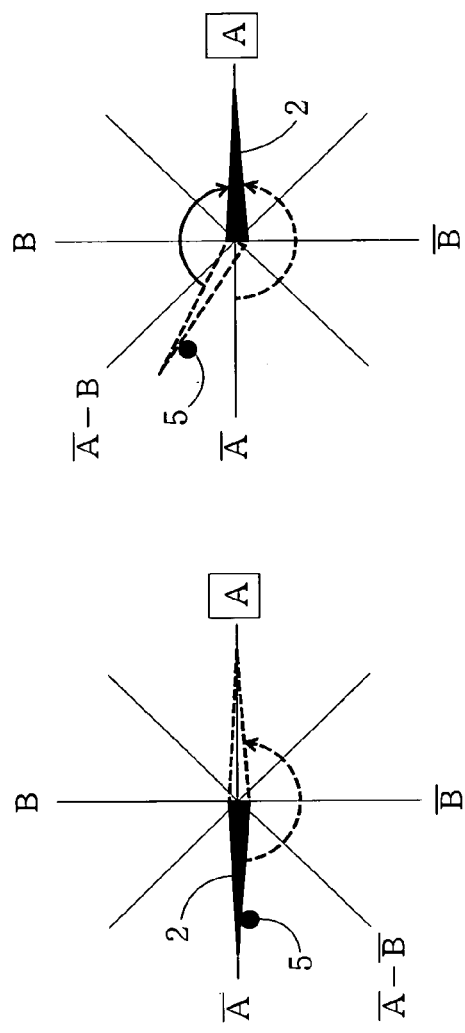
FIG. 21A
FIG. 21B

METHOD AND DEVICE FOR DETECTING INITIAL EXCITATION PHASE OF STEPPING MOTOR

BACKGROUND OF THE INVENTION (1) Field of the Invention

The present invention relates to a method and device for detecting an initial excitation phase of a stepping motor, wherein the initial excitation phase in which a rotor of the stepping motor is stable is detected at a stop position where a reverse rotation of a driven member driven by the stepping motor is forcedly stopped by a stopper.

(2) Description of the Related Art

Recently, a stepping motor has been often used for an on-vehicle meter such as a speed meter or tachometer in terms of indicating accuracy and cost.

However, as for a vehicle in which an on-vehicle meter using such a stepping motor is mounted, by an incorrect drive signal generated due to vehicle vibrations or noises, there might be a problem that an actual amount of movement of a pointer (or indicator) moving in accordance with rotation of the stepping motor is different from an amount of movement thereof, which is originally expected.

Therefore, in an on-vehicle meter using such a stepping motor, for example, at a timing when an ignition key switch is turned on, a pointer or a member of a rotation driving mechanism of the pointer is allowed to abut against a stopper when the pointer rotates in a reverse rotation direction of the pointer (i.e. a direction in which an indicated value on a scale is decreased) so as to conduct an initialization processing, by which the pointer is returned to a zero position defined by the stopper.

During the initialization processing, if an excitation phase is changed to maintain the pointer or the member of the rotation driving mechanism of the pointer rotating in the reverse direction continuously after the pointer or the member abuts against the stopper, the excitation phase is situated less than 180 degrees being viewed from a position of the stopper in a positive rotation direction (i.e. normal rotation direction) of the pointer (i.e. direction in which an indicated value on a scale is increased) so that a magnetic force affecting the rotor in the positive rotation direction from the excitation phase exceeds that in the reverse rotation direction, resulting in that the pointer or the member is instantaneously reversed.

Accordingly, the abutting of the pointer or the member against the stopper must be found out before they are reversed due to the subsequent change in the excitation phase.

Therefore, so far, paying attention to a fact that the excitation phase of the stepping motor indirectly indicates a rotation position of the rotor of the stepping motor and the pointer, an initial excitation phase in which the rotor becomes stable when the pointer or the member abuts against the stopper is set known in advance, so that when the excitation phase of the stepping motor reaches the initial excitation phase, before the pointer or the member (of the rotation driving mechanism of the pointer) reverses, the change in the excitation phase to maintain the pointer to rotate in the reverse direction is stopped.

So far, whether or not the excitation phase of the stepping motor reaches the initial excitation phase has been detected on the basis of a change in an output pattern of two magnetoelectric elements (such as Hall elements) spaced from each other having the same distance as a distance between two magnetic poles adjacent to each other of the rotor (for example, Japanese Patent Application Laid-Open No. H8-322293). Alternatively, it has been detected on the basis of whether or not an induced electromotive force indicating the rotation of the rotor is generated in an exciting coil in a non-excitation state of a stepping motor of full step drive or half step drive (for example, Japanese Patent Application Laid-Open No. 2001-298993).

However, the method using the magnetoelectric elements results in cost-up or a problem that the mechanism becomes complicated due to limitation of the placing position in the proximity of the rotor or deterioration in reliability in a case of avoiding such a limitation. The detection by using the exciting coil in a non-excitation state has a problem that the initial excitation phase can be specified only with a pitch angle of one phase excitation due to a limited detection timing obtained only upon full step driving, therefore the method is not sufficient as a method of detecting the initial excitation phase of the stepping motor of a micro-step drive.

SUMMARY OF THE INVENTION

It is therefore an objective of the present invention to solve the above problems and to provide a method and device for detecting an initial excitation phase of a stepping motor, by which the initial excitation phase can be detected with a pitch angle finer than a pitch angle of one phase excitation without using elements such as magnetoelectric elements that cause cost-up or complication in the mechanism.

In order to attain the above objective, the present invention is to provide a method of detecting an initial excitation phase of a stepping motor, in which at a stop position of a driven member driven by a stepping motor driven with a microstep obtained by dividing one step of a full step drive into m×n (m: integer equal to 1 or more than 1, n: integer equal to 2 or more than 2), a rotation of the driven member in a reverse rotation direction being forcedly stopped by a stopper, an initial excitation phase at which a rotor of the stepping motor is in a stable condition is detected on the basis of whether or not the rotor rotates judged from a pattern of an induced electromotive force generated in an exciting coil in a non-excitation state of the stepping motor during the full step drive, the method including:

a first step in which the full step drive of the stepping motor causing the rotor to rotate in a reverse rotation direction thereof is performed until a first excitation phase is attained at which the rotor is judged not rotating, a rotation of the rotor in the reverse rotation direction thereof causing the driven member to rotate in the reverse rotation direction thereof;

a second step in which the stepping motor is subjected to the microstep drive in the reverse rotation direction of the rotor from a second excitation phase to a third excitation phase, an excitation phase being shifted in the reverse rotation direction of the rotor by an angle, which is obtained by subtracting two step angles of the full step drive of the stepping motor from 180 degrees, so as to reach the second excitation phase from the first excitation phase, and the excitation phase being shifted in the reverse rotation direction of the rotor by m steps of the microstep drive of the stepping motor so as to reach the third excitation phase from the second excitation phase;

a third step in which the stepping motor is subjected to the full step drive in a positive (i.e. normal) or reverse rotation direction of the rotor in a given range of the excitation phase between the third excitation phase and a fourth excitation phase and it is judged whether or not the rotor rotates during the full step drive, the excitation phase being shifted in the positive rotation direction of the rotor by one step of the full step drive of the stepping motor so as to reach the fourth excitation phase from the first excitation phase, a rotation of the rotor in the positive rotation direction thereof causing the driven member to rotate in a positive rotation direction thereof; and a fourth step in which if the rotor is judged rotating in the third step, a fifth excitation phase shifted by 180 degrees from the third excitation phase is determined to be the initial excitation phase and stored in a storage means, wherein if the rotor is judged not rotating, the third excitation phase is shifted by m steps of the microstep drive of the stepping motor in the reverse rotation direction of the rotor and the second step and the third step are repeatedly performed until the rotor is judged rotating in the third step.

In order to attain the above objective, the present invention is to provide a device for detecting an initial excitation phase of a stepping motor, in which at a stop position of a driven member driven by a stepping motor driven with a microstep obtained by dividing one step of a full step drive into m×n (m: integer equal to 1 or more than 1, n: integer equal to 2 or more than 2), a rotation of the driven member in a reverse rotation direction being forcedly stopped by a stopper, an initial excitation phase at which a rotor of the stepping motor is in a stable condition is detected on the basis of whether or not the rotor rotates judged from a pattern of an induced electromotive force generated in an exciting coil in a non-excitation state of the stepping motor during the full step drive, the device including:

a rotor rotation judging means for judging whether or not the rotor rotates during the full step drive of the stepping motor;

a first exciting means for subjecting the stepping motor to the full step drive that causes the rotor to rotate in a reverse rotation direction thereof until a first excitation phase is attained at which the rotor is judged not rotating by the rotor rotation judging means, a rotation of the rotor in the reverse rotation direction thereof causing the driven member to rotate in the reverse rotation direction thereof;

a second exciting means for subjecting the stepping motor to the microstep drive in the reverse rotation direction of the rotor from a second excitation phase to a third excitation phase, an excitation phase being shifted in the reverse rotation direction of the rotor by an angle, which is obtained by subtracting two step angles of the full step drive of the stepping motor from 180 degrees, so as to reach the second excitation phase from the first excitation phase, and the excitation phase being shifted in the reverse rotation direction of the rotor by m steps of the microstep drive of the stepping motor so as to reach the third excitation phase from the second excitation phase;

a third exciting means for subjecting the stepping motor to the full step drive in a positive or reverse rotation direction of the rotor in a given range of the excitation phase between the third excitation phase and a fourth excitation phase, the excitation phase being shifted in the positive rotation direction of the rotor by one step of the full step drive of the stepping motor so as to reach the fourth excitation phase from the first excitation phase, a rotation of the rotor in the positive rotation direction thereof causing the driven member to rotate in a positive rotation direction thereof; and an initial excitation phase determining means for determining a fifth excitation phase shifted by 180 degrees from the third excitation phase to be the initial excitation phase when the rotor rotation judging means judges that the rotor rotates during the full step drive of the stepping motor by the third exciting means and for storing the fifth excitation phase in a storage means;

wherein when the rotor rotation judging means judges that the rotor does not rotate during the full step drive of the stepping motor by the third exciting means, the third excitation phase is shifted by m steps of the microstep drive of the stepping motor in the reverse rotation direction of the rotor, the second and third exciting means drives the stepping motor again, and the rotor rotation judging means judges again whether or not the rotor rotates.

With the construction of the method and device described above, when the first excitation phase is attained, the rotor of the stepping motor does not rotate. It means that there is a forced stop point where the rotation of the driven member in the reverse rotation direction thereof is forcedly stopped by the stopper, said point existing between the fourth excitation phase attained by shifting the excitation phase in the positive rotation direction of the rotor by one step of the full step drive of the stepping motor from the first excitation phase and the excitation phase attained by further shifting the excitation phase in the positive rotation direction of the rotor by one step of the full step drive of the stepping motor from the fourth excitation phase.

If the forced stop point exists between the excitation phase attained by shifting the excitation phase in the positive rotation direction of the rotor by m steps of the microstep drive of the stepping motor from the fourth excitation phase and the adjacent excitation phase attained by further shifting the excitation phase in the positive rotation direction of the rotor by m steps of the microstep drive of the stepping motor, when the stepping motor is subjected to the microstep drive in the reverse rotation direction of the rotor from the second excitation phase to the third excitation phase attained by shifting the excitation phase in the reverse rotation direction of the rotor by m steps of the microstep drive of the stepping motor, the excitation phase that has been nearer in the reverse rotation direction than in the positive rotation direction becomes the excitation phase that has been nearer in the positive rotation direction than in the reverse rotation direction. That is, the magnetic force to the rotor affected by the excitation phase in the positive rotation direction exceeds that in the reverse rotation direction, therefore the rotor and the driven member reverse.

Then, the stepping motor is subjected to the full step drive in the reverse rotation direction of the rotor until the first excitation phase is attained, thereafter while the position of the third excitation phase is shifted in the reverse rotation direction of the rotor by m steps of the microstep drive of the stepping motor, the stepping motor is subjected to the microstep drive in the reverse rotation direction of the rotor until the third excitation phase is attained and thereafter, the full step drive of the stepping motor and the detection of the rotation of the rotor are performed between the third and fourth excitation phases, thereby repeatedly confirming whether or not the rotor and the driven member actually rotate in the excitation phase range where the rotor and the driven member can rotate only after their reversal, so that it is specified at which excitation phase the rotor and the driven member reverse.

Therefore, without using elements such as magnetoelectric elements that cause cost-up or complication in the mechanism due to limitation of a place for mounting such elements, only by judging the rotation of the rotor on the basis of a pattern of the induced electromotive force generated in an exciting coil in a non-excitation state, which judgment can performed only during the full step drive of the stepping motor, the forced stop point of the rotation of the driven member in the reverse rotation direction thereof can be detected in a unit of m steps of the microstep drive that is smaller than one step of the full step drive of the stepping motor, that is, the initial excitation phase on which the rotor is in a stable condition at the forced stop point can be detected.

Preferably, in the method of detecting an initial excitation phase of a stepping motor, the third step includes:

a first partial step in which the stepping motor is subjected to a microstep drive in the positive rotation direction of the rotor from the third excitation phase to the first excitation phase; and a second partial step in which the stepping motor is subjected to a full step drive in the positive or reverse rotation direction of the rotor between the first excitation phase and the fourth excitation phase and it is judged whether or not the rotor rotates during the full step drive.

Preferably, in the device of detecting an initial excitation phase of a stepping motor, the third exciting means includes:

a first partial exciting means for subjecting the stepping motor to a microstep drive in the positive rotation direction of the rotor from the third excitation phase to the first excitation phase; and a second partial exciting means for subjecting the stepping motor to a full step drive in the positive or reverse rotation direction of the rotor between the first excitation phase and the fourth excitation phase.

With the construction described above, in order to judge whether or not the rotor rotates during the full step drive of the stepping motor, in the exciting of the stepping motor in the third step or by the third exciting means, when the stepping motor is subjected to the full step drive in the positive or reverse rotation direction of the rotor, the excitation phase of the stepping motor is once changed from the third excitation phase that is not the excitation phase upon the full step drive to the first excitation phase that is the excitation phase upon the full step drive, thereby preventing the subsequent excitation phase of the full step drive of the stepping motor from shifting.

BRIEF DESCRIPTION OF THE DRAWINGS

FIGS. 6A-6C are illustrations of a relation between a rotation position of a rotor and pointer in FIG. 2 and an excitation phase of a stepping motor in an action for detecting an initial excitation phase according to a sequence shown in FIG. 5;

FIGS. 7A-7C are illustrations of a relation between a rotation position of a rotor and pointer in FIG. 2 and an excitation phase of a stepping motor in an action for detecting an initial excitation phase according to a sequence shown in FIG. 5;

FIGS. 8A-8C are illustrations of a relation between a rotation position of a rotor and pointer in FIG. 2 and an excitation phase of a stepping motor in an action for detecting an initial excitation phase according to a sequence shown in FIG. 5;

FIGS. 9A-9C are illustrations of a relation between a rotation position of a rotor and pointer in FIG. 2 and an excitation phase of a stepping motor in an action for detecting an initial excitation phase according to a sequence shown in FIG. 5;

FIGS. 18A-18C are illustrations of a relation between a rotation position of a rotor and pointer in FIG. 2 and an excitation phase of a stepping motor in an action for detecting an initial excitation phase according to a sequence shown in FIG. 16;

FIGS. 19A-19C are illustrations of a relation between a rotation position of a rotor and pointer in FIG. 2 and an excitation phase of a stepping motor in an action for detecting an initial excitation phase according to a sequence shown in FIG. 16;

FIGS. 20A-20C are illustrations of a relation between a rotation position of a rotor and pointer in FIG. 2 and an excitation phase of a stepping motor in an action for detecting an initial excitation phase according to a sequence shown in FIG. 16;

FIGS. 21A and 21B are illustrations of a relation between a rotation position of a rotor and pointer in FIG. 2 and an excitation phase of a stepping motor in an action for detecting an initial excitation phase according to a sequence shown in FIG. 16;

DESCRIPTION OF THE PREFERRED EMBODIMENTS

In the following, the preferred embodiments of the present invention will be explained with reference to the attached drawings.

Figure 2:
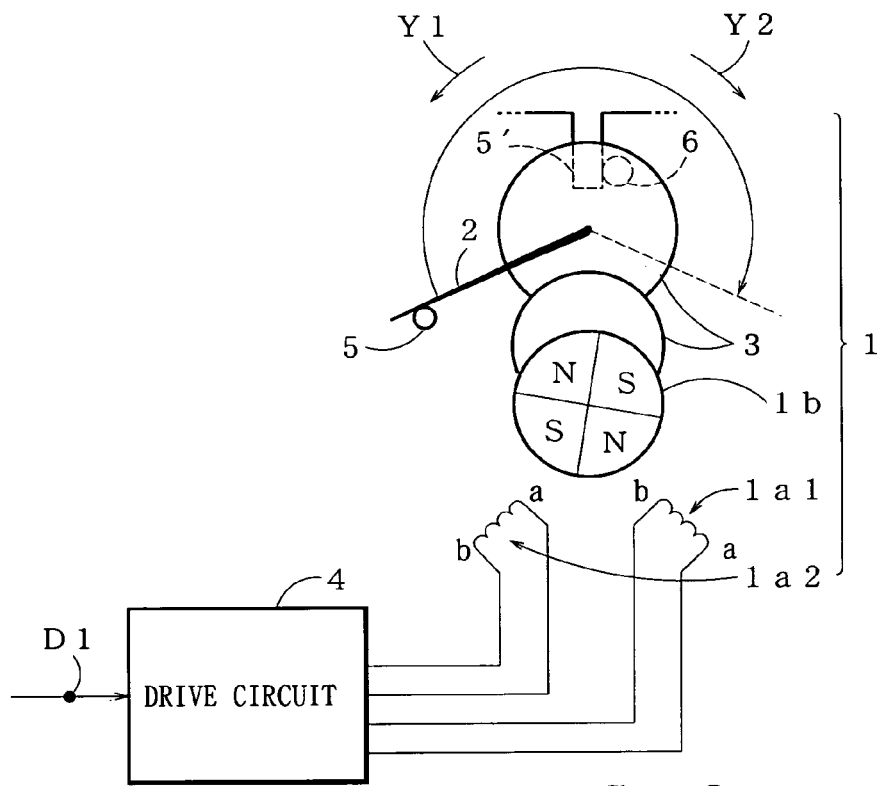
FIG. 2 shows a construction of an on-vehicle meter to which the present invention is applied.

FIG. 2 shows a construction of an on-vehicle meter to which the present invention is applied. The on-vehicle meter is, for example, a speed meter including: two exciting coils (i.e. magnetizing coils) $1a1$ and $1a2$ wound up around respective stators (not shown in the figure) arranged crossing at right angles to each other; a stepping motor 1 having a rotor $1b$ which rotates in response to a change in an excitation state (i.e. magnetization state) of the exciting coils $1a1$ and $1a2$; and a drive circuit 4 for driving the stepping motor 1.

The on-vehicle meter further includes: a pointer 2 as a driven member which moves in response to a rotation drive of the rotor $1b$; a gear 3 for transmitting the rotation drive of the rotor $1b$ to the pointer 2; and a stopper 5 which allows the pointer 2 to come in contact with the stopper 5 at a mechanical zero position so as to stop the pointer 2. In this connection, instead of the zero position by the contact between the stopper 5 and the pointer 2, such a construction may be adopted that a zero position is provided by contact between a stopper piece 6 as a driven member that projects from the gear 3 and another stopper 5' disposed at a position corresponding to the zero position.

Figure 3:
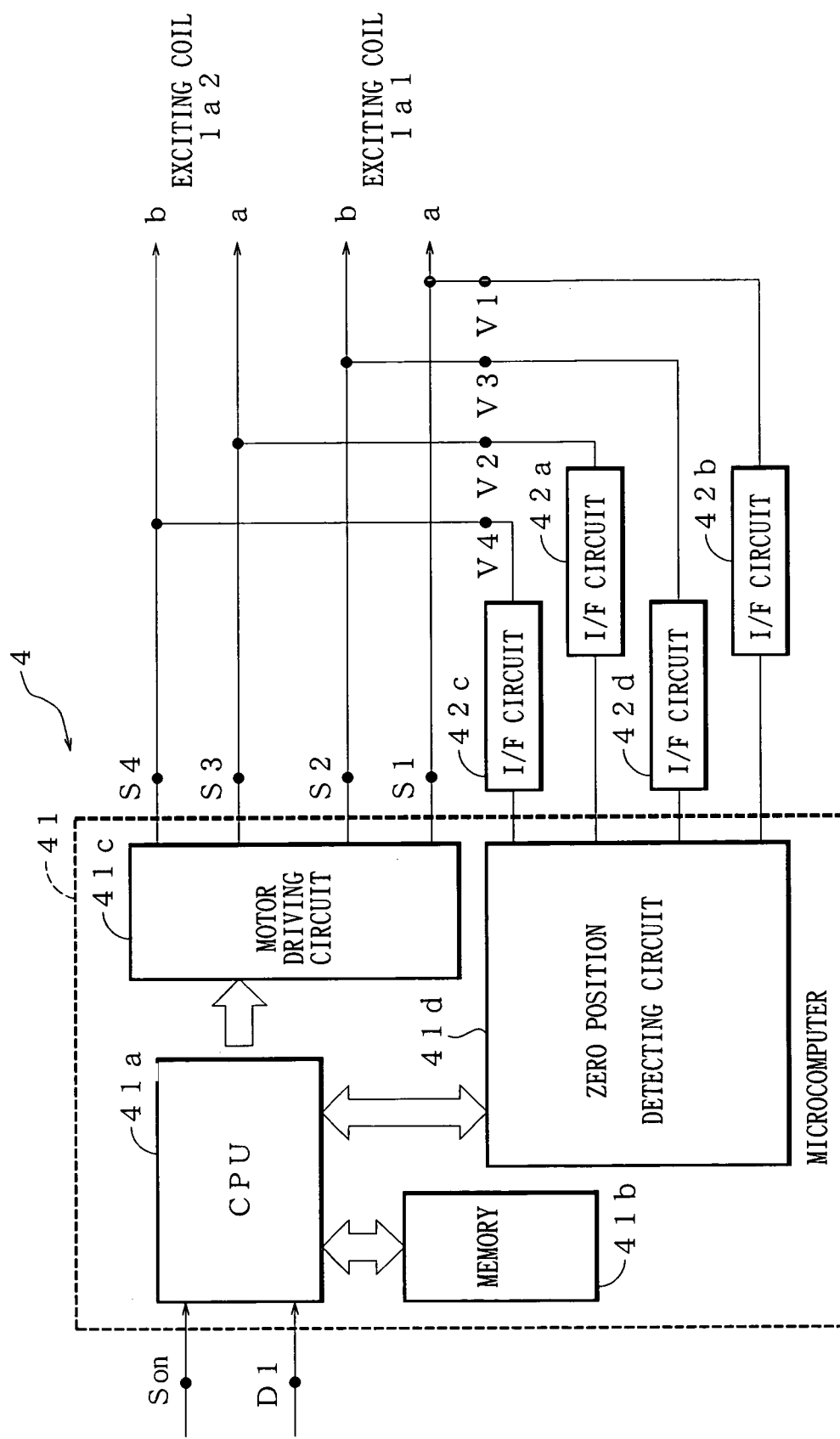
FIG. 3 is a block diagram illustrating an outline of a construction of a drive circuit of an on-vehicle meter shown in FIG. 2 according to a preferred embodiment of a method and device for detecting an initial excitation phase of a stepping motor of the present invention.

FIG. 3 is a block diagram illustrating an outline of a construction of the drive circuit 4 of the on-vehicle meter shown in FIG. 2 according to a preferred embodiment of a method and device for detecting an initial excitation phase (i.e. initial exciting phase) of a stepping motor of the present invention.

The drive circuit 4 includes a microcomputer 41 as a control means. The microcomputer 41 includes: a central processing unit (CPU) $41a$ for performing various processings according to a program; a memory $41b$ (the storage means); a motor driving circuit $41c$; and a zero position detecting circuit $41d$.

The CPU $41a$ receives angle data signals D1 calculated on the basis of speed information from a vehicle speed sensor (not shown in the figure) and an H-level initialization command signals Son on the basis of an ignition-on operation of an ignition switch (not shown in the figure). The CPU $41a$ outputs exciting signals S1, S2, S3 and S4 from the motor driving circuit $41c$ to both ends a and b of the exciting coils $1a1$ and $1a2$.

The zero position detecting circuit $41d$ receives induced voltages V1, V2, V3 and V4 through I/F circuits (i.e. interface circuits) $42a$, $42b$, $42c$ and $42d$ connected to the respective ends a and b of the exciting coils $1a1$ and $1a2$ and outputs zero position judging signals to the CPU $41a$.

Upon normal operation on which the CPU $41a$ rotates the pointer 2 to an instructed position corresponding to the angle data signal D1 from the vehicle speed sensor, the CPU $41a$ controls an excitation state of the exciting coils $1a1$ and $1a2$ in a microstep drive mode in response to the angle data signal D1 so as to drive-control the stepping motor 1 so that the rotor $1b$ is rotated in the positive (i.e. normal) direction (Y2) or the reverse direction (Y1) in response to the angle data signal D1.

Upon initialization processing operation on which the CPU $41a$ detects an initial excitation phase (i.e. initial magnetization phase) in which the rotor $1b$ is in a stable condition at a stop position where the pointer 2 rotating in the reverse direction (i.e. in a direction in which a scale value indicated by the pointer 2 is decreased) comes in contact with the stopper 5 so as to stop, the CPU $41a$ controls an excitation state of the exciting coils $1a1$ and $1a2$ by using a microstep drive mode and a full step drive mode together according to a need in response to the initialization command signals Son so as to drive-control the stepping motor 1 so that the rotor $1b$ is inversely rotated to move the pointer 2 toward the stopper 5 (i.e. in the reverse rotation direction of the pointer 2=the direction Y1 of the rotor b1).

The zero position detecting circuit $41d$ receives the induced voltages generated at both ends of the exciting coils $1a1$ and $1a2$ in its non-excitation state, an end of which exciting coil is opened in match with a detection timing signal during the full step operation upon the initialization processing operation, through the I/F circuits as inputs. When the inputted induced voltage becomes equal to or less than a threshold value, the zero position detecting circuit $41d$ outputs a zero position judging signal judging that the pointer 2 comes in contact with the stopper 5 to be at a zero position to the CPU $41a$. That is, the exciting coils $1a1$ and $1a2$ act as detection elements of the induced voltage when an end thereof is opened.

Figure 4:
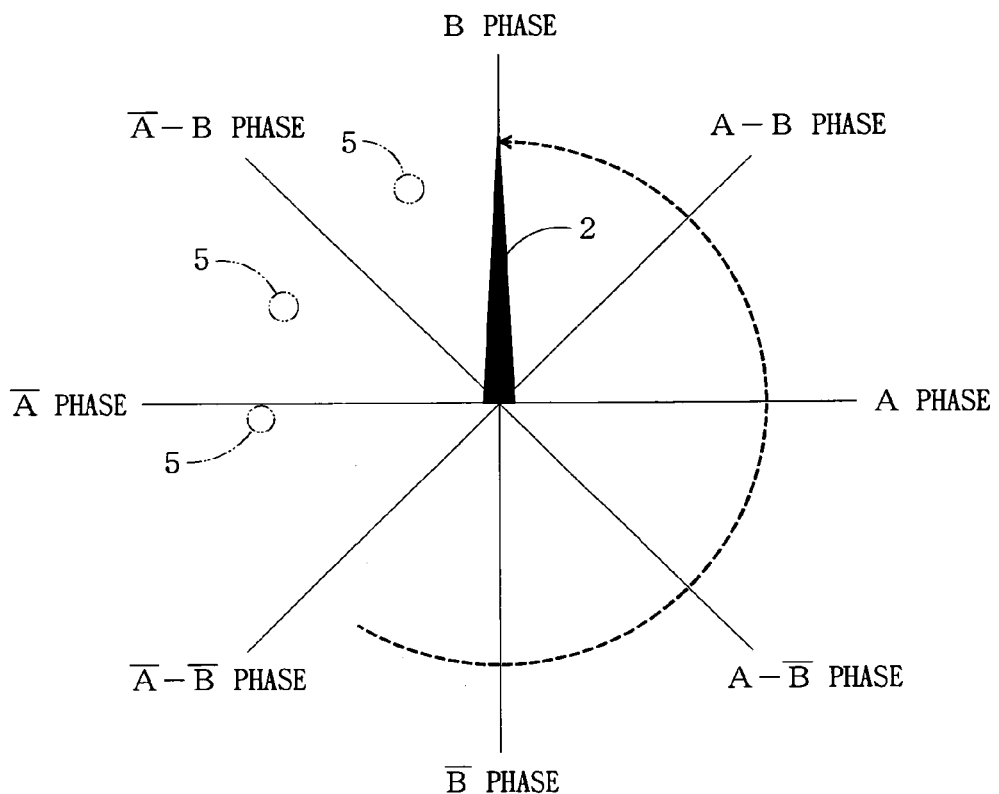
FIG. 4 is an illustration of an example of a microstep drive mode by a stepping motor shown in FIG. 2.

In this connection, in the microstep mode upon normal operation or initialization processing operation, $1/n$ microstep ($n \geq 3$) can be used. In the preferred embodiment, for example, a microstep in which an electrical one cycle is divided into 64 pieces. FIG. 4 shows an excitation phase (i.e. magnetization phase) of the stepping motor 1.

In the following, the initialization processing operation performed by the on-vehicle meter described above being triggered with an input of the initialization command signal Son accompanied by, for example, the ignition switch-on will be explained with reference to FIG. 5 (flow chart) and FIGS. 6-15 (relation between a rotation position and an excitation phase).

First, assuming that the rotor $1b$ exists at one of A phase, B phase, inverted A phase (i.e. inverted phase of A phase), and inverted B phase (i.e. inverted phase of B phase), that is, at one of the excitation phases during a full step drive, at the first step S1, a drive in the reverse direction by one step by the full step drive and a measurement of an induced electromotive force in the exciting coil $1a1$ ($1a2$) in a non-excitation state are performed. In this connection, the inverted A phase is shown as A bar and the inverted B phase is shown as B bar in the pertinent figures. At the subsequent step S2, it is confirmed whether or not a rotation state of the rotor $1b$ computed from a pattern of the measured induced electromotive force is in a stop condition. That is, it is confirmed that the measured induced electromotive force is equal to or less than the threshold value so that the stop of the rotor $1b$ is confirmed or, alternatively, that the measured induced electromotive force exceeds the threshold value so that the stop of the rotor $1b$ is not confirmed. If the stop of the rotor $1b$ is not confirmed (N at step S2), the step S1 is repeated until the stop of the rotor $1b$ is confirmed.

If the stop of the rotor $1b$ is confirmed at step S2, while the excitation phase of the rotor $1b$ is changed by 90 degrees in the reverse rotation direction, the pointer 2 actually comes in contact with the stopper 5 so that the pointer 2 and rotor 1b are kept in the stop condition. In this case, if the induced electromotive force generated in the exciting coil 1a1 (1a2) in a non-excitation state between the inverted A phase and inverted B phase shown in FIG. 4 is equal to or less than the threshold value, as a position of the stopper 5 there are three possibilities, that is, a position between the B phase and inverted A-B phase as shown in FIG. 6C, a position between the inverted A-B phase and inverted A phase as shown in FIG. 6B, and a position equal to that of the inverted A phase shown in FIG. 6A.

However, the existence or non-existence of the induced electromotive force in the exciting coil 1a1 (1a2) in a non-excitation state can measured only in a situation in which the rotor 1b and the pointer 2 rotate by 90 degrees such as during a full step drive like the step S1. Therefore, thereafter, a processing to confirm the position of the stopper 5, that is, to confirm which position the stopper 5 takes among the position between the B phase and inverted A-B phase, the position between the inverted A-B phase and inverted A phase, and the position equal to that of the inverted A phase is performed.

That is, if the stop of the rotor 1b is confirmed at step S2, by the microstep drive, the excitation phase of the rotor 1b currently set at the inverted B phase is further advanced by 45 degrees in the reverse rotation direction so as to set the excitation phase to be the A-inverted B phase (step S3).

If the position of the stopper 5 is between the B phase and inverted A-B phase, the current excitation phase, i.e. the A-inverted B phase is less than 180 degrees in the positive rotation direction (i.e. normal rotation direction) viewed from the position of the stopper 5, and the magnetic force affecting the rotor 1b from the A-inverted B phase in the positive rotation direction exceeds that in the reverse rotation direction, therefore, as shown in FIG. 7C, the rotor 1b and the pointer 2 are reversed so as to be positioned at the A-inverted B phase that is the excitation phase.

On the other hand, if the position of the stopper 5 is between the inverted A-B phase and inverted A phase or equal to that of the inverted A phase, the current excitation phase, i.e. the A-inverted B phase is equal to or more than 180 degrees in the positive rotation direction viewed from the position of the stopper 5, and the magnetic force affecting the rotor 1b from the A-inverted B phase in the reverse rotation direction in succession exceeds that in the positive rotation direction, therefore, as shown in FIGS. 7B and 7A, the rotor 1b and the pointer 2 are not reversed and keep the original position shown in FIGS. 6B and 6A.

Then, in order to confirm whether or not the rotor 1b and the pointer 2 are reversed, it is confirmed whether or not the rotor 1b and the pointer 2 rotate in an excitation phase range from the current excitation phase, i.e. the A-inverted B phase to the inverted A phase. Here, the inverted A phase is situated in the most upstream side in the positive rotation direction in an excitation phase range from the inverted A phase to the inverted B phase, in which range the stop of the rotor 1b is confirmed at the step S2.

That is, the excitation phase of the rotor 1b is returned by 135 degrees in the positive rotation direction from the current excitation phase, i.e. the A-inverted B phase so that the excitation phase is set to be the inverted A phase that is the nearest excitation phase of the full step drive (step S4) and thereafter, the excitation phase of the rotor 1b is advanced by 90 degrees in the reverse rotation direction by the full step drive, that is, by one step of the full step drive so that the excitation phase is set to be the inverted B phase, then during the change in the excitation phase from the inverted A phase to the inverted B phase by the full step drive, the induced electromotive force in the exciting coil 1a1 (1a2) in a non-excitation state is measured (step S5) and then, at the subsequent step S6 it is confirmed whether or not the measured induced electromotive force exceeds the threshold value, that is, whether or not the rotor 1b rotates.

Then, if the position of the stopper 5 is between the B phase and the inverted A-B phase, since upon the processing at step S3 the rotor 1b and the pointer 2 are reversed being situated at the A-inverted B phase, therefore, as shown in FIG. 8C upon the processing at step S4 the rotor 1b and the pointer 2 rotate by 135 degrees from the A-inverted B phase in the positive rotation direction to reach the inverted A phase and subsequently, as shown in FIG. 9C upon the processing at step S5 the rotor 1b and the pointer 2 rotate by one step of the full step drive in the reverse rotation direction and are situated at the inverted B phase.

On the other hand, if the position of the stopper 5 is between the inverted A-B phase and inverted A phase or equal to that of the inverted A phase, even if the excitation phase is shifted to the positive rotation direction by 135 degrees to be changed to the inverted A phase upon the processing at step S4 and even if the excitation phase is shifted to the reverse rotation direction by one step of the full step drive to be changed to the inverted B phase upon the processing at step S5, since both of the inverted A and inverted B phases are situated at a position equal to or more than 180 degrees in the positive rotation direction viewed from the position of the stopper 5, therefore the magnetic force in the reverse rotation direction affecting the rotor 1b from each excitation phase of the inverted A and inverted B phases in succession exceeds the magnetic force in the positive rotation direction and accordingly, as shown in FIGS. 8B, 8A, 9B and 9A, the rotor 1b and the pointer 2 are not reversed and keep the original position as shown in FIGS. 6A and 6B.

When in step S5 the induced electromotive force in the exciting coil 1a1 (1a2) in a non-excitation state is measured, if the position of the stopper 5 is situated between the B phase and the inverted A-B phase, the induced electromotive force exceeding the threshold value is measured and the rotor 1b is confirmed being rotated (Y at step S6), so that it is judged that the position of the stopper 5 is between the B phase and the inverted A-B phase and that the inverted A-B phase, which is situated at the most downstream side in the positive rotation direction in the range between the B phase and the inverted A-B phase, is the initial excitation phase of the rotor 1b, and thus the inverted A-B phase is stored as the initial excitation phase in the memory 41b (step S7) and the processing is finished.

On the other hand, if the position of the stopper 5 is between the inverted A-B phase and inverted A phase or equal to that of the inverted A phase, at step S6 it is confirmed that the induced electromotive force generated in the exciting coil 1a1 (1a2) in a non-excitation state is equal to or less than the threshold value, that is, that the rotor 1b is stopped (N at step S6), therefore, subsequently, the following processings are performed in order to judge which position the stopper 5 takes, between the inverted A-B phase and inverted A phase or equal to that of the inverted A phase, and further, to judge where the initial excitation phase of the rotor 1b is.

That is, if the stop of the rotor 1b is confirmed at step S6, by the microstep drive, the excitation phase of the rotor 1b currently set at the inverted B phase is advanced by 90 degrees in the reverse rotation direction (step S8). In other words, the step S8 corresponds to a processing in which the excitation phase is advanced in the reverse rotation direction from the inverted B phase to the A phase by 90 degrees in total, said 90 degrees consisting of the 45 degrees being advanced in the reverse rotation direction from the inverted B phase at step S3 and the additional 45 degrees being advanced in step S8.

Figure 10A:
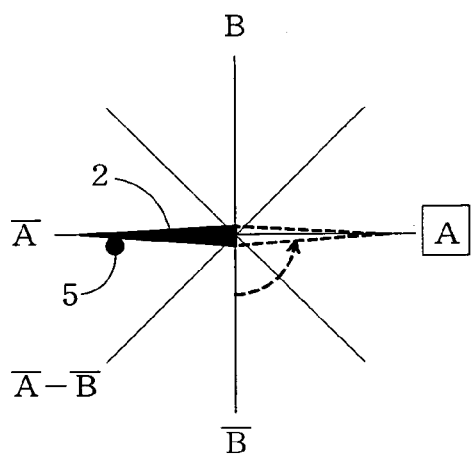
FIGS. 10A and 10B are illustrations of a relation between a rotation position of a rotor and pointer in FIG. 2 and an excitation phase of a stepping motor in an action for detecting an initial excitation phase according to a sequence shown in FIG. 5.
Figure 10B:
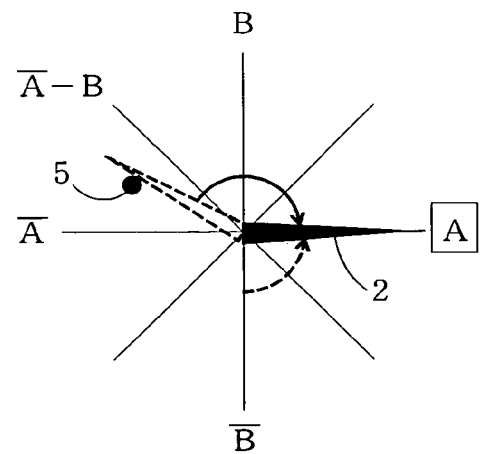

If the position of the stopper 5 is between the inverted A-B phase and inverted A phase, the current excitation phase, i.e. the A phase is less than 180 degrees in the positive rotation direction viewed from the position of the stopper 5, and the magnetic force affecting the rotor 1b from the A phase in the positive rotation direction exceeds that in the reverse rotation direction, therefore, as shown in FIG. 10B, the rotor 1b and the pointer 2 are reversed so as to be positioned at the A phase that is the excitation phase.

On the other hand, if the position of the stopper 5 is equal to that of the inverted A phase, the current excitation phase, i.e. the A phase is equal to or more than 180 degrees in the positive rotation direction viewed from the position of the stopper 5, and the magnetic force affecting the rotor 1b from the A phase in the reverse rotation direction in succession exceeds that in the positive rotation direction, therefore, as shown in FIG. 10A, the rotor 1b and the pointer 2 are not reversed and keep the original position shown in FIG. 6A.

Then, in order to confirm whether or not the rotor 1b and the pointer 2 are reversed, it is confirmed whether or not the rotor 1b and the pointer 2 rotate in an excitation phase range from the current excitation phase, i.e. the A phase to the inverted A phase. Here, the inverted A phase is situated in the most upstream side in the positive rotation direction in an excitation phase range from the inverted A phase to the inverted B phase, in which range the stop of the rotor 1b is confirmed at the step S2.

That is, the excitation phase of the rotor 1b is returned by 180 degrees in the positive rotation direction from the current excitation phase, i.e. the A phase so that the excitation phase is set to be the inverted A phase that is the nearest excitation phase of the full step drive (step S9) and thereafter, the excitation phase of the rotor 1b is advanced by 90 degrees in the reverse rotation direction by the full step drive, that is, by one step of the full step drive so that the excitation phase is set to be the inverted B phase, then during the change in the excitation phase from the inverted A phase to the inverted B phase by the full step drive, the induced electromotive force in the exciting coil 1a1 (1a2) in a non-excitation state is measured (step S10) and then, at the subsequent step S11 it is confirmed whether or not the measured induced electromotive force exceeds the threshold value, that is, whether or not the rotor 1b rotates.

Figure 1:
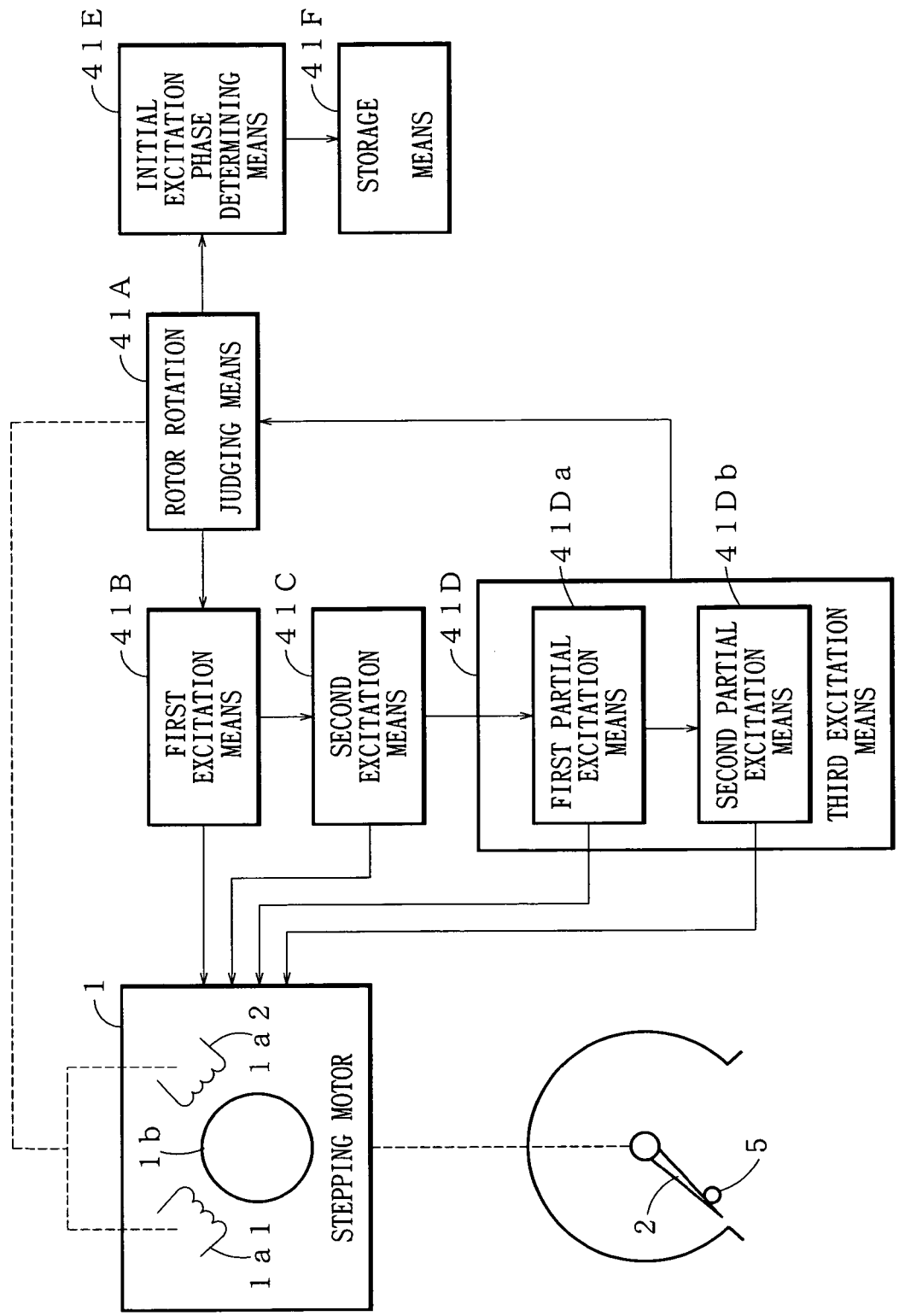
FIG. 1 shows a basic construction of a device for detecting an initial excitation phase of a stepping motor according to the present invention.
Figure 12A:
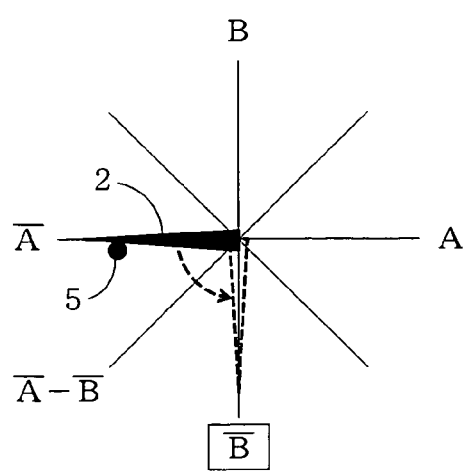
FIGS. 12A and 12B are illustrations of a relation between a rotation position of a rotor and pointer in FIG. 2 and an excitation phase of a stepping motor in an action for detecting an initial excitation phase according to a sequence shown in FIG. 5.
Figure 12B:
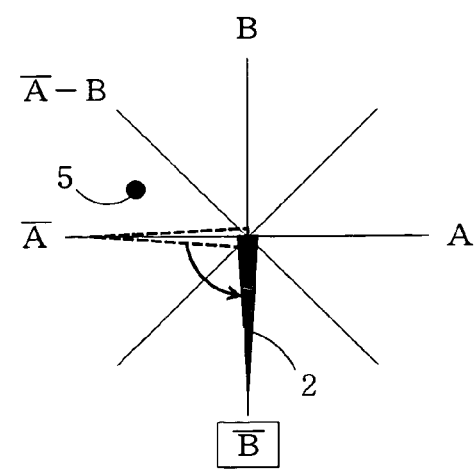

Then, if the position of the stopper 5 is between the inverted A-B phase and the inverted A phase, since upon the processing at step S8 the rotor 1b and the pointer 2 are reversed being situated at the A phase, therefore, as shown in FIG. 1B upon the processing at step S9 the rotor 1b and the pointer 2 rotate by 180 degrees from the A phase in the positive rotation direction to reach the inverted A phase and subsequently, as shown in FIG. 12B upon the processing at step S10 the rotor 1b and the pointer 2 rotate by one step of the full step drive in the reverse rotation direction and are situated at the inverted B phase.

Figure 11A:
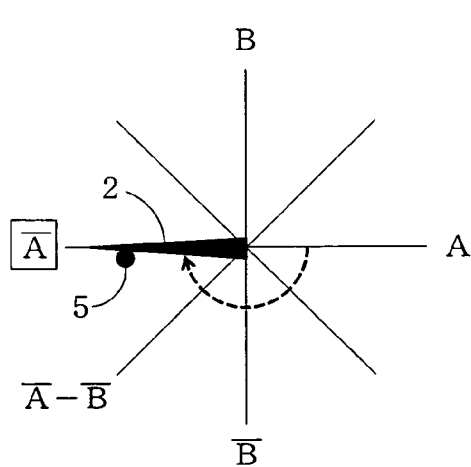
FIGS. 11A and 11B are illustrations of a relation between a rotation position of a rotor and pointer in FIG. 2 and an excitation phase of a stepping motor in an action for detecting an initial excitation phase according to a sequence shown in FIG. 5.
Figure 11B:
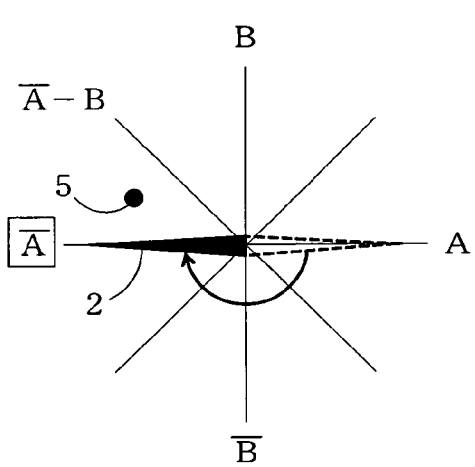

On the other hand, if the position of the stopper 5 is equal to that of the inverted A phase, even if the excitation phase is shifted to the positive rotation direction by 180 degrees to be changed to the inverted A phase upon the processing at step S9 and even if the excitation phase is shifted to the reverse rotation direction by one step of the full step drive to be changed to the inverted B phase upon the processing at step S10, since both of the inverted A and inverted B phases are situated at a position equal to or more than 180 degrees in the positive rotation direction viewed from the position of the stopper 5, therefore the magnetic force in the reverse rotation direction affecting the rotor 1b from each excitation phase of the inverted A and inverted B phases in succession exceeds the magnetic force in the positive rotation direction and accordingly, as shown in FIGS. 11A and 12A, the rotor 1b and the pointer 2 are not reversed and keep the original position as shown in FIG. 6A.

When at step S10 the induced electromotive force in the exciting coil 1a1 (1a2) in a non-excitation state is measured, if the position of the stopper 5 is situated between the inverted A-B phase and the inverted A phase, the induced electromotive force exceeding the threshold value is measured and the rotor 1b is confirmed being rotated (Y at step S1), so that it is judged that the position of the stopper 5 is between the inverted A-B phase and the inverted A phase and that the inverted A phase, which is situated at the most downstream side in the positive rotation direction in the range between the inverted A-B phase and the inverted A phase, is the initial excitation phase of the rotor 1b, and thus the inverted A phase is stored as the initial excitation phase in the memory 41b (step S12) and the processing is finished.

If the position of the stopper 5 is equal to that of the inverted A phase, at step S11 it is confirmed that the induced electromotive force generated in the exciting coil 1a1 (1a2) in a non-excitation state is equal to or less than the threshold value, that is, that the rotor 1b is stopped (N at step S1), therefore, subsequently, the following processings are performed in order to judge whether the position of the stopper 5 is equal to that of the inverted A phase, and further, to judge where the initial excitation phase of the rotor 1b is.

That is, if the stop of the rotor 1b is confirmed at step S11, by the microstep drive, the excitation phase of the rotor 1b currently set at the inverted B phase is advanced by 135 degrees in the reverse rotation direction (step S13). In other words, the step S13 corresponds to a processing in which the excitation phase is advanced in the reverse rotation direction from the inverted B phase to the A-B phase by 135 degrees in total, said 135 degrees consisting of the 45 degrees being advanced in the reverse rotation direction from the inverted B phase at step S3 and the additional 90 degrees being advanced in step S13.

Figure 13:
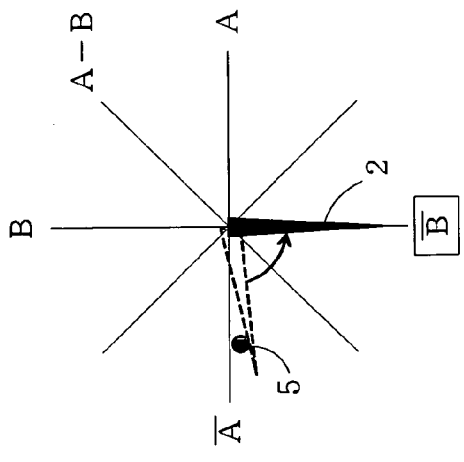
FIG. 13 is an illustration of a relation between a rotation position of a rotor and pointer in FIG. 2 and an excitation phase of a stepping motor in an action for detecting an initial excitation phase according to a sequence shown in FIG. 5.

If the position of the stopper 5 is equal to that of the inverted A phase, the current excitation phase, i.e. the A-B phase is less than 180 degrees in the positive rotation direction viewed from the position of the stopper 5, and the magnetic force affecting the rotor 1b from the A-B phase in the positive rotation direction exceeds that in the reverse rotation direction, therefore, as shown in FIG. 13, the rotor 1b and the pointer 2 are reversed so as to be positioned at the A-B phase that is the excitation phase.

Then, in order to confirm whether or not the rotor 1b and the pointer 2 are reversed, it is confirmed whether or not the rotor 1b and the pointer 2 rotate in an excitation phase range from the current excitation phase, i.e. the A-B phase to the inverted A phase. Here, the inverted A phase is situated in the most upstream side in the positive rotation direction in an excitation phase range from the inverted A phase to the inverted B phase, in which range the stop of the rotor 1b is confirmed at the step S2.

That is, the excitation phase of the rotor 1b is returned by 225 degrees in the positive rotation direction from the current excitation phase, i.e. the A-B phase so that the excitation phase is set to be the inverted A phase that is the nearest excitation phase of the full step drive (step S14) and thereafter, the excitation phase of the rotor 1b is advanced by 90 degrees in the reverse rotation direction by the full step drive, that is, by one step of the full step drive so that the excitation phase is set to be the inverted B phase, then during the change in the excitation phase from the inverted A phase to the inverted B phase by the full step drive, the induced electromotive force in the exciting coil $1a1$ ($1a2$) in a non-excitation state is measured (step S15) and then, at the subsequent step S16 it is confirmed whether or not the measured induced electromotive force exceeds the threshold value, that is, whether or not the rotor $1b$ rotates.

Figure 14:
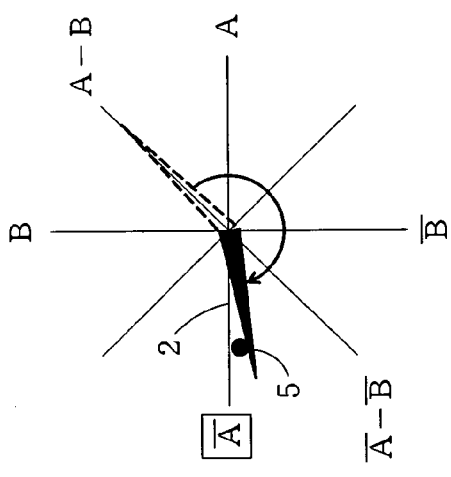
FIG. 14 is an illustration of a relation between a rotation position of a rotor and pointer in FIG. 2 and an excitation phase of a stepping motor in an action for detecting an initial excitation phase according to a sequence shown in FIG. 5.
Figure 15:
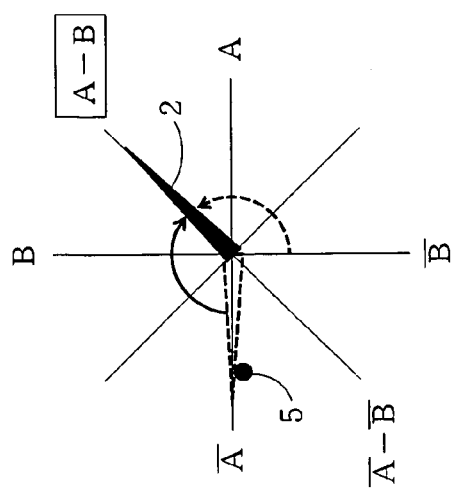
FIG. 15 is an illustration of a relation between a rotation position of a rotor and pointer in FIG. 2 and an excitation phase of a stepping motor in an action for detecting an initial excitation phase according to a sequence shown in FIG. 5.

Then, since upon the processing at step S13 the rotor $1b$ and the pointer 2 are reversed being situated at the A-B phase, therefore, as shown in FIG. 14 upon the processing at step S14 the rotor $1b$ and the pointer 2 rotate by 225 degrees from the A-B phase in the positive rotation direction to reach the inverted A phase and subsequently, as shown in FIG. 15 upon the processing at step S15 the rotor $1b$ and the pointer 2 rotate by one step of the full step drive in the reverse rotation direction and are situated at the inverted B phase.

When at step S15 the induced electromotive force in the exciting coil $1a1$ ($1a2$) in a non-excitation state is measured, if the position of the stopper 5 is equal to that of the inverted A phase, the induced electromotive force exceeding the threshold value is measured and the rotor $1b$ is confirmed being rotated (Y at step S16), so that it is judged that the position of the stopper 5 is equal to that of the inverted A phase and that the inverted A-inverted B phase, which is nearest to the inverted A phase on the downstream side in the reverse rotation direction in the range, is the initial excitation phase of the rotor $1b$, and thus the inverted A-inverted B phase is stored as the initial excitation phase in the memory $41b$ (step S17) and the processing is finished.

At the step S16, if it is confirmed that the induced electromotive force generated in the exciting coil $1a1$ ($1a2$) in a non-excitation state is equal to or less than the threshold value, that is, if it is confirmed that the rotor $1b$ is stopped (N at step 16), it follows that upon the processing at step S13 the rotor $1b$ and the pointer 2 do not reverse, therefore an error processing is performed (step S18) assuming that there is an abnormal in the stepping motor 1, and the processing is finished.

Figure 5:
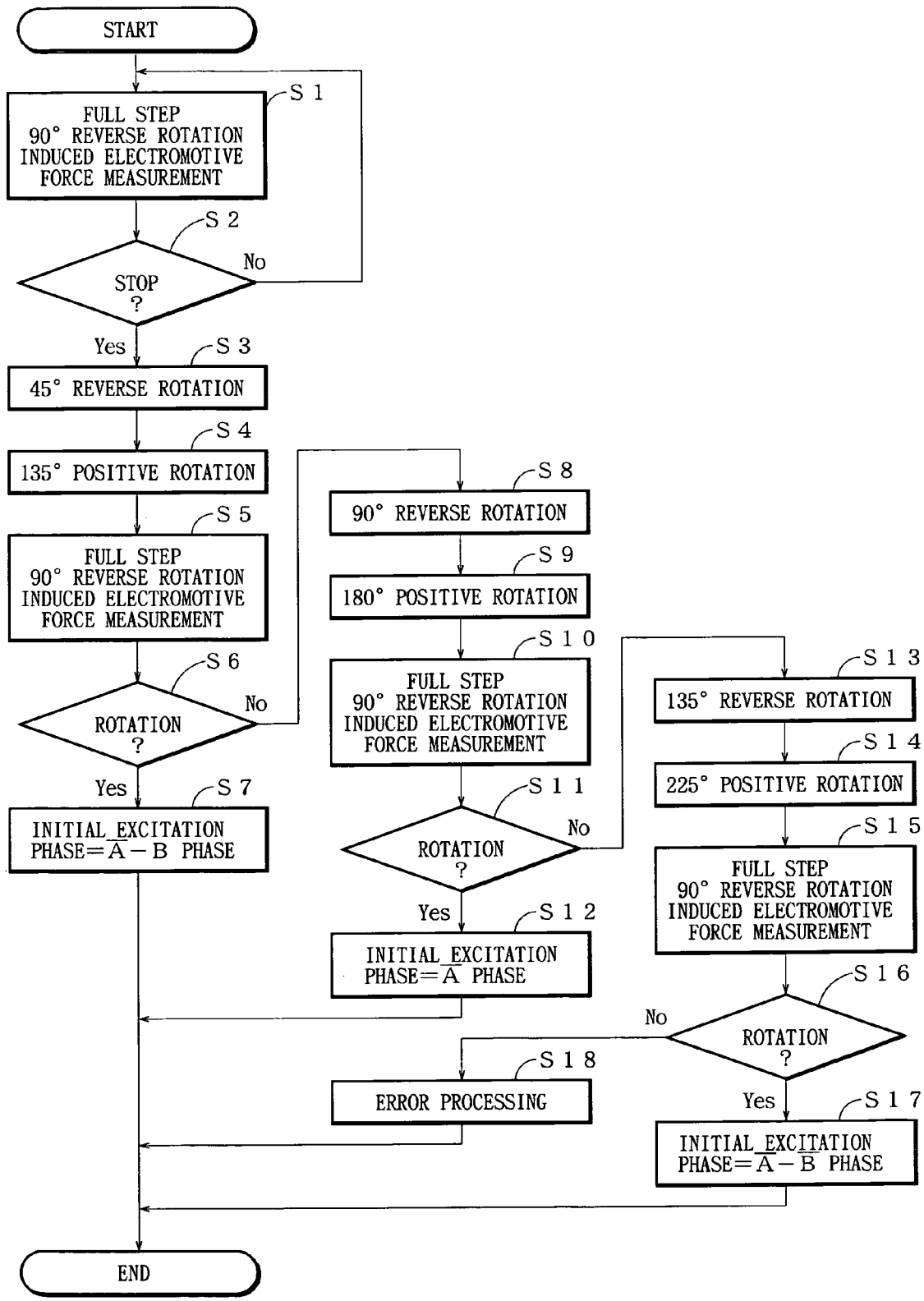
FIG. 5 is a flow chart illustrating an example of a sequence for detecting an initial excitation phase, which is performed by a CPU shown in FIG. 3.

As is clear from the above explanation, in the preferred embodiment, the steps S1, S2, S5, S6, S10, S11, S15 and S16 in the flow chart shown in FIG. 5 are the processings which correspond to the rotor rotation judging means (i.e. means for judging the existence or non-existence of the rotor rotation) 41A.

In the preferred embodiment, the steps S1 and S2 in the flow chart shown in FIG. 5 are the processings which correspond to the first exciting means 41B, while the steps S3, S8 and S13 in the flow chart shown in FIG. 5 are the processings which correspond to the second exciting means 41C.

In the preferred embodiment, the portions until the excitation phase reaches the inverted B phase of the respective steps S4, S9 and S14 in the flow chart shown in FIG. 5 are the processings which correspond to the first partial exciting means 41Da, while the steps S5, S10 and S15 in the flow chart shown in FIG. 5 are the processings which correspond to the second partial exciting means 41Db, and the steps S4-S6, S9-S11 and S14-S16, which include the above steps, are the processings which correspond to the third exciting means 41D.

In the preferred embodiment, the steps S7, S12 and S17 in the flow chart shown in FIG. 5 are the processings which correspond to the initial excitation phase determining means 41E.

In the preferred embodiment, the steps S1 and S2 in the flow chart shown in FIG. 5 are the processings which correspond to the first step, while the steps S3, S8 and S13 in the flow chart shown in FIG. 5 are the processings which correspond to the second step.

In the preferred embodiment, the portions until the excitation phase reaches the inverted B phase of the respective steps S4, S9 and S14 in the flow chart shown in FIG. 5 are the processings which correspond to the first partial step, while the steps S5, S10 and S15 in the flow chart shown in FIG. 5 are the processings which correspond to the second partial step, and the steps S4-S6, S9-S11 and S14-S16, which include the above steps, are the processings which correspond to the third step.

In the preferred embodiment, the steps S7, S12 and S17 in the flow chart shown in FIG. 5 are the processings which correspond to the fourth step.

Thus, as for the on-vehicle meter according to the preferred embodiment of the present invention, upon appropriately changing an excitation phase of a stepping motor 1, depending upon whether or not the induced electromotive force generated in the exciting coil $1a1$ ($1a2$) in a non-excitation state upon the full step drive is equal to or less than the threshold value, whether or not the pointer 2 comes in contact with the stopper 5 to stop the reverse rotation of the pointer 2 and rotor $1b$ is judged so that it is specified on which excitation phase the pointer 2 and rotor $1b$ are reversed, thereby detecting the initial excitation phase of the rotor $1b$ corresponding to the position of the stopper 5.

Therefore, with the construction of the on-vehicle meter according to the present invention, the initial excitation phase of the rotor $1b$ corresponding to the position of the stopper 5 can be detected with a unit of a stepping angle of a microstep drive which is smaller than that of a full step drive without using elements such as magnetoelectric elements that cause cost-up or complication in the mechanism due to limitation of a place for mounting such elements.

The processings performed by the CPU $41a$ to confirm whether or not the pointer 2 reverses is not limited to the contents shown in the flow chart in FIG. 5. For example, the range of the full step drive or the rotation direction of the rotor $1b$ when it is confirmed whether or not the induced electromotive force generated in the exciting coil $1a1$ ($1a2$) in a non-excitation state exceeds the threshold value by changing the excitation phase by one step of the full step drive may be different from those shown in the flow chart in FIG. 5.

In the following, another pattern of the processings which can be performed by the CPU $41a$ to confirm whether or not the pointer 2 reverses will be explained with reference to FIG. 16 (flow chart) and FIGS. 17-25 (relation between a rotation position and an excitation phase).

First, assuming that the rotor $1b$ exists at one of A phase, B phase, inverted A phase (i.e. inverted phase of A phase), and inverted B phase (i.e. inverted phase of B phase), that is, at one of the excitation phases during a full step drive, from the first step S21 to the step S23 the same processings as those from the step S1 to the step S3 are performed.

If the position of the stopper 5 is between the B phase and inverted A-B phase, the current excitation phase, i.e. the A-inverted B phase is less than 180 degrees in the positive rotation direction viewed from the position of the stopper 5, and the magnetic force affecting the rotor $1b$ from the A-inverted B phase in the positive rotation direction exceeds that in the reverse rotation direction, therefore, as shown in FIG. 18C, the rotor $1b$ and the pointer 2 are reversed so as to be positioned at the A-inverted B phase that is the excitation phase.

Figure 17A:
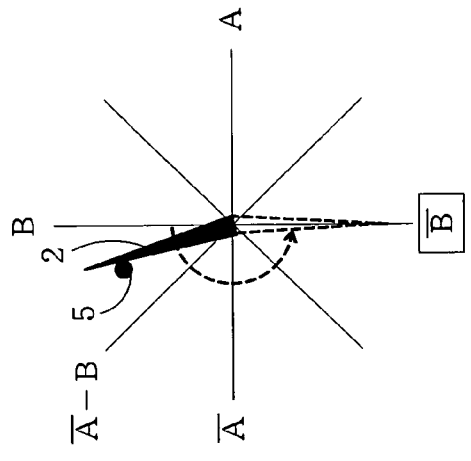
FIGS. 17A-17C are illustrations of a relation between a rotation position of a rotor and pointer in FIG. 2 and an excitation phase of a stepping motor in an action for detecting an initial excitation phase according to a sequence shown in FIG. 16.
Figure 17B:
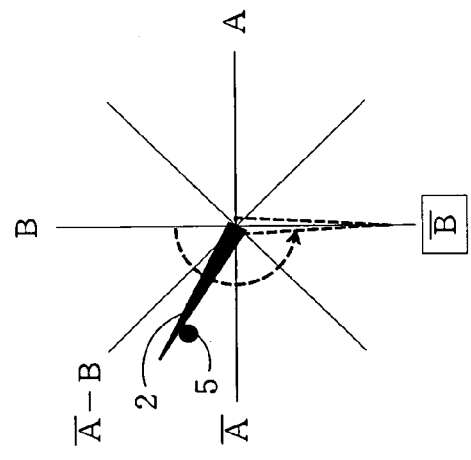
Figure 17C:
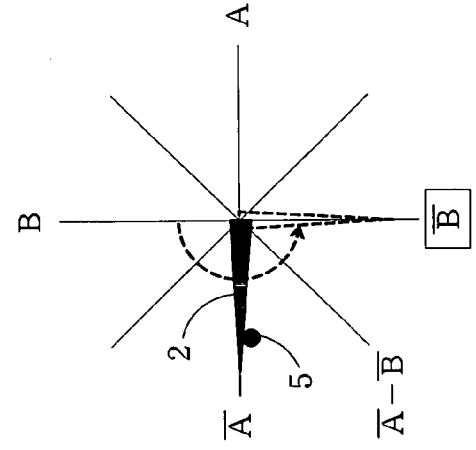

On the other hand, if the position of the stopper 5 is between the inverted A-B phase and inverted A phase or equal to that of the inverted A phase, the current excitation phase, i.e. the A-inverted B phase is equal to or more than 180 degrees in the positive rotation direction viewed from the position of the stopper 5, and the magnetic force affecting the rotor 1b from the A-inverted B phase in the reverse rotation direction in succession exceeds that in the positive rotation direction, therefore, as shown in FIGS. 18B and 18A, the rotor 1b and the pointer 2 are not reversed and keep the original position shown in FIGS. 17B and 17A.

Then, in order to confirm whether or not the rotor 1b and the pointer 2 are reversed, it is confirmed whether or not the rotor 1b and the pointer 2 rotate in an excitation phase range from the current excitation phase, i.e. the A-inverted B phase to the inverted A phase. Here, the inverted A phase is situated in the most upstream side in the positive rotation direction in an excitation phase range from the inverted A phase to the inverted B phase, in which range the stop of the rotor 1b is confirmed at the step S22.

That is, the excitation phase of the rotor 1b is returned by the microstep drive by 45 degrees in the positive rotation direction from the current excitation phase, i.e. the A-inverted B phase so that the excitation phase is set to be the inverted B phase that is the nearest excitation phase of the full step drive (step S24) and thereafter, the excitation phase of the rotor 1b is returned by 90 degrees in the positive rotation direction by the full step drive, that is, by one step of the full step drive so that the excitation phase is set to be the inverted A phase, then during the change in the excitation phase from the inverted B phase to the inverted A phase by the full step drive, the induced electromotive force in the exciting coil 1a1 (1a2) in a non-excitation state is measured (step S25) and then, at the subsequent step S26 it is confirmed whether or not the measured induced electromotive force exceeds the threshold value, that is, whether or not the rotor 1b rotates.

Then, if the position of the stopper 5 is between the B phase and the inverted A-B phase, since upon the processing at step S23 the rotor 1b and the pointer 2 are reversed being situated at the A-inverted B phase, therefore, as shown in FIG. 19C upon the processing at step S24 the rotor 1b and the pointer 2 rotate by 45 degrees from the A-inverted B phase in the positive rotation direction to reach the inverted B phase and subsequently, as shown in FIG. 20C upon the processing at step S25 the rotor 1b and the pointer 2 rotate by one step of the full step drive in the positive rotation direction and are situated at the inverted A phase.

On the other hand, if the position of the stopper 5 is between the inverted A-B phase and inverted A phase or equal to that of the inverted A phase, even if the excitation phase is shifted to the positive rotation direction by 45 degrees to be changed to the inverted B phase upon the processing at step S24 and even if the excitation phase is shifted to the positive rotation direction by one step of the full step drive to be changed to the inverted A phase upon the processing at step S25, since both of the inverted B and inverted A phases are situated at a position equal to or more than 180 degrees in the positive rotation direction viewed from the position of the stopper 5, therefore the magnetic force in the reverse rotation direction affecting the rotor 1b from each excitation phase of the inverted B and inverted A phases in succession exceeds the magnetic force in the positive rotation direction and accordingly, as shown in FIGS. 19B, 19A, 20B and 20A, the rotor 1b and the pointer 2 are not reversed and keep the original position as shown in FIGS. 17A and 17B.

When in step S25 the induced electromotive force in the exciting coil 1a1 (1a2) in a non-excitation state is measured, if the position of the stopper 5 is situated between the B phase and the inverted A-B phase, the induced electromotive force exceeding the threshold value is measured and the rotor 1b is confirmed being rotated (Y at step S26), so that it is judged that the position of the stopper 5 is between the B phase and the inverted A-B phase and that the inverted A-B phase, which is situated at the most downstream side in the positive rotation direction in the range between the B phase and the inverted A-B phase, is the initial excitation phase of the rotor 1b, and thus the inverted A-B phase is stored as the initial excitation phase in the memory 41b (step S27) and the processing is finished.

On the other hand, if the position of the stopper 5 is between the inverted A-B phase and inverted A phase or equal to that of the inverted A phase, at step S26 it is confirmed that the induced electromotive force generated in the exciting coil 1a1 (1a2) in a non-excitation state is equal to or less than the threshold value, that is, that the rotor 1b is stopped (N at step S26), therefore, subsequently, the following processings are performed in order to judge which position the stopper 5 takes, between the inverted A-B phase and inverted A phase or equal to that of the inverted A phase, and further, to judge where the initial excitation phase of the rotor 1b is.

That is, if the stop of the rotor 1b is confirmed at step S26, by the microstep drive, the excitation phase of the rotor 1b currently set at the inverted A phase is advanced by 180 degrees in the reverse rotation direction (step S28). In other words, the step S28 corresponds to a processing in which the excitation phase is advanced in the reverse rotation direction from the inverted B phase to the A phase by 90 degrees in total, said 90 degrees consisting of the 45 degrees being advanced in the reverse rotation direction from the inverted B phase at step S23 and the additional 45 degrees being advanced in step S28.

If the position of the stopper 5 is between the inverted A-B phase and inverted A phase, the current excitation phase, i.e. the A phase is less than 180 degrees in the positive rotation direction viewed from the position of the stopper 5, and the magnetic force affecting the rotor 1b from the A phase in the positive rotation direction exceeds that in the reverse rotation direction, therefore, as shown in FIG. 21B, the rotor 1b and the pointer 2 are reversed so as to be positioned at the A phase that is the excitation phase.

On the other hand, if the position of the stopper 5 is equal to that of the inverted A phase, the current excitation phase, i.e. the A phase is equal to or more than 180 degrees in the positive rotation direction viewed from the position of the stopper 5, and the magnetic force affecting the rotor 1b from the A phase in the reverse rotation direction in succession exceeds that in the positive rotation direction, therefore, as shown in FIG. 21A, the rotor 1b and the pointer 2 are not reversed and keep the original position shown in FIG. 17A.

Then, in order to confirm whether or not the rotor 1b and the pointer 2 are reversed, it is confirmed whether or not the rotor 1b and the pointer 2 rotate in an excitation phase range from the current excitation phase, i.e. the A phase to the inverted A phase. Here, the inverted A phase is situated in the most upstream side in the positive rotation direction in an excitation phase range from the inverted A phase to the inverted B phase, in which range the stop of the rotor 1b is confirmed at the step S22.

That is, the excitation phase of the rotor 1b is returned by 90 degrees in the positive rotation direction from the current excitation phase, i.e. the A phase so that the excitation phase is set to be the inverted B phase that is the nearest excitation phase of the full step drive, then during the change in the excitation phase from the A phase to the inverted B phase by the full step drive, the induced electromotive force in the exciting coil 1a1 (1a2) in a non-excitation state is measured (step S29) and then, at the subsequent step S30 it is confirmed whether or not the measured induced electromotive force exceeds the threshold value, that is, whether or not the rotor 1b rotates.

Figure 22A:
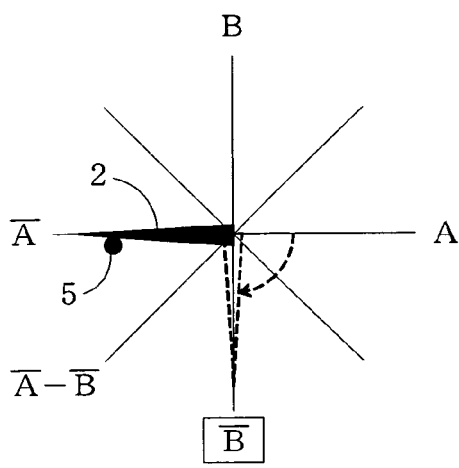
FIGS. 22A and 22B are illustrations of a relation between a rotation position of a rotor and pointer in FIG. 2 and an excitation phase of a stepping motor in an action for detecting an initial excitation phase according to a sequence shown in FIG. 16.
Figure 22B:
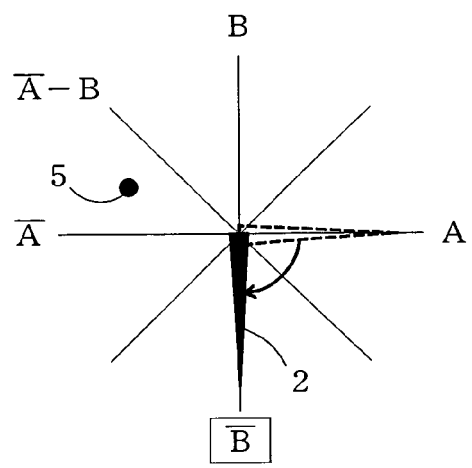

Then, if the position of the stopper 5 is between the inverted A-B phase and the inverted A phase, since upon the processing at step S28 the rotor 1b and the pointer 2 are reversed being situated at the A phase, therefore, as shown in FIG. 22B upon the processing at step S29 the rotor 1b and the pointer 2 rotate by one step of the full step drive from the A phase in the positive rotation direction to reach the inverted B phase.

On the other hand, if the position of the stopper 5 is equal to that of the inverted A phase, even if the excitation phase is shifted to the positive rotation direction by one step of the full step drive to be changed to the inverted B phase upon the processing at step S29, since the inverted B phase is situated at a position equal to or more than 180 degrees in the positive rotation direction viewed from the position of the stopper 5, therefore the magnetic force in the reverse rotation direction affecting the rotor 1b from the inverted B phase in succession exceeds the magnetic force in the positive rotation direction and accordingly, as shown in FIG. 22A, the rotor 1b and the pointer 2 are not reversed and keep the original position as shown in FIG. 17A.

When at step S29 the induced electromotive force in the exciting coil 1a1 (1a2) in a non-excitation state is measured, if the position of the stopper 5 is situated between the inverted A-B phase and the inverted A phase, the induced electromotive force exceeding the threshold value is measured and the rotor 1b is confirmed being rotated (Y at step S30), so that it is judged that the position of the stopper 5 is between the inverted A-B phase and the inverted A phase and that the inverted A phase, which is situated at the most downstream side in the positive rotation direction in the range between the inverted A-B phase and the inverted A phase, is the initial excitation phase of the rotor 1b, and thus the inverted A phase is stored as the initial excitation phase in the memory 41b (step S31) and the processing is finished.

If the position of the stopper 5 is equal to that of the inverted A phase, at step S30 it is confirmed that the induced electromotive force generated in the exciting coil 1a1 (1a2) in a non-excitation state is equal to or less than the threshold value, that is, that the rotor 1b is stopped (N at step S30), therefore, subsequently, the following processings are performed in order to judge whether the position of the stopper 5 is equal to that of the inverted A phase, and further, to judge where the initial excitation phase of the rotor 1b is.

That is, if the stop of the rotor 1b is confirmed at step S30, by the microstep drive, the excitation phase of the rotor 1b currently set at the inverted B phase is advanced by 135 degrees in the reverse rotation direction (step S32). In other words, the step S32 corresponds to a processing in which the excitation phase is advanced in the reverse rotation direction from the inverted B phase to the A-B phase by 135 degrees in total, said 135 degrees consisting of the 45 degrees being advanced in the reverse rotation direction from the inverted B phase at step S23 and the additional 90 degrees being advanced in step S32.

Figure 23:
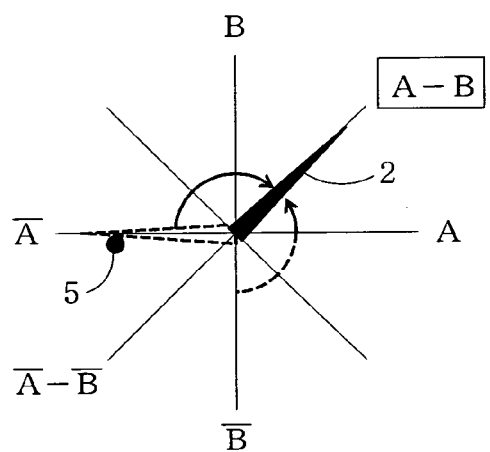
FIG. 23 is an illustration of a relation between a rotation position of a rotor and pointer in FIG. 2 and an excitation phase of a stepping motor in an action for detecting an initial excitation phase according to a sequence shown in FIG. 16.

If the position of the stopper 5 is equal to that of the inverted A phase, the current excitation phase, i.e. the A-B phase is less than 180 degrees in the positive rotation direction viewed from the position of the stopper 5, and the magnetic force affecting the rotor 1b from the A-B phase in the positive rotation direction exceeds that in the reverse rotation direction, therefore, as shown in FIG. 23, the rotor 1b and the pointer 2 are reversed so as to be positioned at the A-B phase that is the excitation phase.

Then, in order to confirm whether or not the rotor 1b and the pointer 2 are reversed, it is confirmed whether or not the rotor 1b and the pointer 2 rotate in an excitation phase range from the current excitation phase, i.e. the A-B phase to the inverted A phase. Here, the inverted A phase is situated in the most upstream side in the positive rotation direction in an excitation phase range from the inverted A phase to the inverted B phase, in which range the stop of the rotor 1b is confirmed at the step S22.

That is, the excitation phase of the rotor 1b is returned by 45 degrees in the positive rotation direction from the current excitation phase, i.e. the A-B phase so that the excitation phase is set to be the A phase that is the nearest excitation phase of the full step drive (step S33) and thereafter, the excitation phase of the rotor 1b is advanced by 90 degrees in the positive rotation direction by the full step drive, that is, by one step of the full step drive so that the excitation phase is set to be the inverted B phase, then during the change in the excitation phase from the A phase to the inverted B phase by the full step drive, the induced electromotive force in the exciting coil 1a1 (1a2) in a non-excitation state is measured (step S34) and then, at the subsequent step S35 it is confirmed whether or not the measured induced electromotive force exceeds the threshold value, that is, whether or not the rotor 1b rotates.

Figure 24:
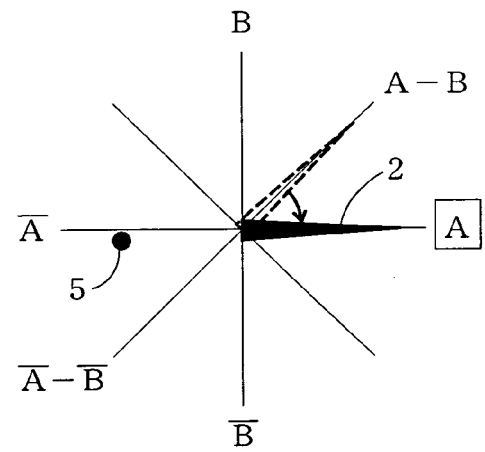
FIG. 24 is an illustration of a relation between a rotation position of a rotor and pointer in FIG. 2 and an excitation phase of a stepping motor in an action for detecting an initial excitation phase according to a sequence shown in FIG. 16.
Figure 25:
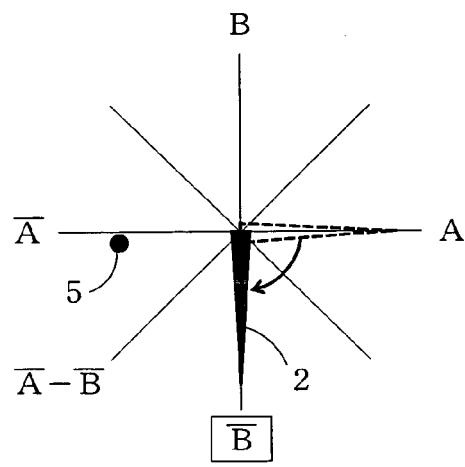
FIG. 25 is an illustration of a relation between a rotation position of a rotor and pointer in FIG. 2 and an excitation phase of a stepping motor in an action for detecting an initial excitation phase according to a sequence shown in FIG. 16.

Then, since upon the processing at step S32 the rotor 1b and the pointer 2 are reversed being situated at the A-B phase, therefore, as shown in FIG. 24 upon the processing at step S33 the rotor 1b and the pointer 2 rotate by 45 degrees from the A-B phase in the positive rotation direction to reach the A phase and subsequently, as shown in FIG. 25 upon the processing at step S34 the rotor 1b and the pointer 2 rotate by one step of the full step drive in the positive rotation direction and are situated at the inverted B phase.

When at step S34 the induced electromotive force in the exciting coil 1a1 (1a2) in a non-excitation state is measured, if the position of the stopper 5 is equal to that of the inverted A phase, the induced electromotive force exceeding the threshold value is measured and the rotor 1b is confirmed being rotated (Y at step S35), so that it is judged that the position of the stopper 5 is equal to that of the inverted A phase and that the inverted A-inverted B phase, which is nearest to the inverted A phase on the downstream side in the reverse rotation direction in the range, is the initial excitation phase of the rotor 1b, and thus the inverted A-inverted B phase is stored as the initial excitation phase in the memory 41b (step S36) and the processing is finished.

At the step S35, if it is confirmed that the induced electromotive force generated in the exciting coil 1a1 (1a2) in a non-excitation state is equal to or less than the threshold value, that is, if it is confirmed that the rotor 1b is stopped (N at step 35), it follows that upon the processing at step S32 the rotor 1b and the pointer 2 do not reverse, therefore an error processing is performed (step S37) assuming that there is an abnormal in the stepping motor 1, and the processing is finished.

Figure 16:
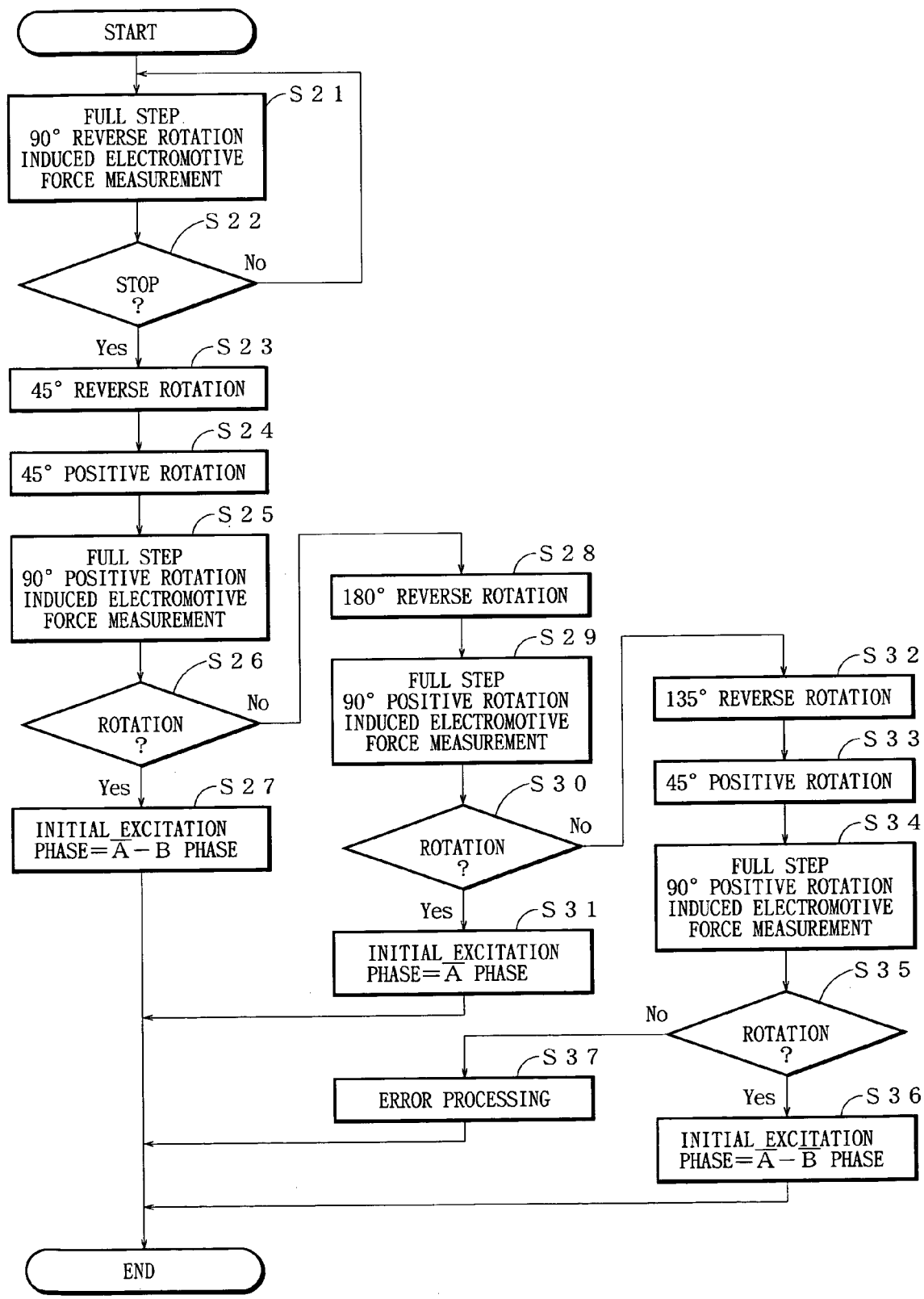
FIG. 16 is a flow chart illustrating another example of a sequence for detecting an initial excitation phase, which is performed by a CPU shown in FIG. 3.

As is clear from the above explanation, in the preferred embodiment, the steps S21, S22, S25, S26, S29, S30, S34 and S35 in the flow chart shown in FIG. 16 are the processings which correspond to the rotor rotation judging means (i.e. means for judging the existence or non-existence of the rotor rotation) 41A.

In the preferred embodiment, the steps S21 and S22 in the flow chart shown in FIG. 16 are the processings which correspond to the first exciting means 41B, while the steps S23, S28 and S32 in the flow chart shown in FIG. 16 are the processings which correspond to the second exciting means 41C.

In the preferred embodiment, the steps S24 and S33 in the flow chart shown in FIG. 16 are the processings which correspond to the first partial exciting means 41Da, while the steps S25 and S34 in the flow chart shown in FIG. 16 are the processings which correspond to the second partial exciting means 41Db, and the steps S24-S26, S33-S35, S29 and S30, which include the above steps, are the processings which correspond to the third exciting means 41D.

In the preferred embodiment, the steps S27, S31 and S36 in the flow chart shown in FIG. 16 are the processings which correspond to the initial excitation phase determining means 41E.

In the preferred embodiment, the steps S21 and S22 in the flow chart shown in FIG. 16 are the processings which correspond to the first step, while the steps S23, S28 and S32 in the flow chart shown in FIG. 16 are the processings which correspond to the second step.

In the preferred embodiment, the steps S24 and S33 in the flow chart shown in FIG. 16 are the processings which correspond to the first partial step, while the steps S25 and S34 in the flow chart shown in FIG. 16 are the processings which correspond to the second partial step, and the steps S24-S26, S33-S35, S29 and S30, which include the above steps, are the processings which correspond to the third step.

In the preferred embodiment, the steps S27, S31 and S36 in the flow chart shown in FIG. 16 are the processings which correspond to the fourth step.

The on-vehicle meter according to the preferred embodiment explained with reference to FIGS. 16 and 17-25 has similar effects to those of the on-vehicle meter according to the preferred embodiment explained with reference to FIGS. 5 and 6-15.

In the preferred embodiments described above, as an example, the stepping angle of the full step drive is set to be 90 degrees for the stepping motor 1. However, the stepping angle is not limited to 90 degrees for the stepping motor, to which the present invention is applied.

Further, in the preferred embodiments described above, the microstep, in which an electrical one cycle is divided into 64 pieces, is used as an example. However, the number of the division is not limited to 64.

Further, the present invention can be applied to a case in which a stepping motor that performs a half step drive as equivalent to the two-division microstep drive is used.

In a case in which the present invention is applied to a stepping motor having a stepping angle different from 90 degrees for the full step drive or a stepping motor having the number of the division different from 64 for the microstep drive, by replacing a case of a half step drive with a case of a two-division microstep drive for an explanation, changing patterns of the excitation phase in the respective processings may be set as follows.

That is, when the initial excitation phase of the stepping motor driven by the microstep, in which one step of the full step drive is divided by m×n (m: integer equal to 1 or more than 1, n: integer equal to 2 or more than 2), is detected, the stepping motor is subjected to the full step drive in the reverse rotation direction of the rotor until it reaches the first excitation phase at which it is judged that the induced electromotive force generated in the exciting coil in a non-excitation state is equal to or less than the threshold value and that the rotation of the rotor is stopped.

Thereafter, the stepping motor is subjected to the microstep drive in the reverse rotation direction of the rotor from the second excitation phase to the third excitation phase. Here, as a definition, from the first excitation phase, the excitation phase is shifted in the reverse rotation direction of the rotor by an angle, which is obtained by subtracting two step angles of the full step drive of the stepping motor from 180 degrees, so as to reach the second excitation phase. Here, also as a definition, from the second excitation phase, the excitation phase is shifted in the reverse rotation direction of the rotor by m steps of the microstep drive of the stepping motor so as to reach the third excitation phase.

Subsequently, the stepping motor is subjected to the full step drive in the positive or reverse rotation direction of the rotor in a given range of the excitation phase between the third excitation phase and the fourth excitation phase and it is judged whether or not the rotor rotates during the full step drive. Here, as a definition, from the first excitation phase, the excitation phase is shifted in the positive rotation direction of the rotor by one step of the full step drive of the stepping motor so as to reach the fourth excitation phase.

If the induced electromotive force generated in the exciting coil in a non-excitation state exceeds the threshold value and therefore the rotor is judged rotating, the fifth excitation phase shifted by 180 degrees from the third excitation phase is determined as the initial excitation phase and this is stored in the memory 41b.

On the other hand, if the induced electromotive force generated in the exciting coil in a non-excitation state is equal to or less than the threshold value and therefore the rotor is judged stopped, until the induced electromotive force generated in the exciting coil in a non-excitation state exceeds the threshold value and therefore the rotor is judged rotating, shifting the third excitation phase by m steps of the microstep drive of the stepping motor in the reverse rotation direction of the rotor, (a) the microstep drive of the stepping motor in the reverse rotation direction of the rotor until reaching the third excitation phase, (b) the full step drive of the stepping motor in the positive or reverse rotation direction of the rotor in a given range of the excitation phase between the third excitation phase and the fourth excitation phase, and (c) the judgment whether or not the rotor rotates during the full step drive on the basis of a pattern of the induced electromotive force in the exciting coil in a non-excitation state are repeatedly performed.

In the explanation described above, as an example, when the induced electromotive force generated in the exciting coil in a non-excitation state during the full step drive is equal to or less than the threshold value, the rotor is judged stopped, while when the induced electromotive force generated in the exciting coil in a non-excitation state during the full step drive exceeds the threshold value, the rotor is judged rotating. However, a method of judging whether or not the rotor rotates on the basis of a pattern of the induced electromotive force in the exciting coil in a non-excitation state during the full step drive is not limited to the method described above.

For example, the following methods may be possible: a method in which when the induced electromotive force generated in the exciting coil in a non-excitation state during the full step drive is zero, the rotor is judged stopped, on the other hand, when the induced electromotive force is not zero, the rotor is judged rotating; and a combined method between the method explained in the preferred embodiments and the above method or a either single method, in which when the induced electromotive force generated in the exciting coil in a non-excitation state during the full step drive is equal to or less than the threshold value for a predetermined period of time or more, the rotor is judged stopped, while when the induced electromotive force generated in the exciting coil in a non-excitation state during the full step drive exceeds the threshold value for a predetermined period of time or more, the rotor is judged rotating.

What is claimed is:

1. A method of detecting an initial excitation phase of a stepping motor, in which at a stop position of a driven member driven by a stepping motor driven with a microstep obtained by dividing one step of a full step drive into m×n, m: integer equal to 1 or more than 1, n: integer equal to 2 or more than 2, a rotation of the driven member in a reverse rotation direction being forcedly stopped by a stopper, an initial excitation phase at which a rotor of the stepping motor is in a stable condition is detected on the basis of whether or not the rotor rotates judged from a pattern of an induced electromotive force generated in an exciting coil in a non-excitation state of the stepping motor during the full step drive, the method comprising:

a first step in which the full step drive of the stepping motor causing the rotor to rotate in a reverse rotation direction thereof is performed until a first excitation phase is attained at which the rotor is judged not rotating, a rotation of the rotor in the reverse rotation direction thereof causing the driven member to rotate in the reverse rotation direction thereof;

a second step in which the stepping motor is subjected to the microstep drive in the reverse rotation direction of the rotor from a second excitation phase to a third excitation phase, an excitation phase being shifted in the reverse rotation direction of the rotor by an angle, which is obtained by subtracting two step angles of the full step drive of the stepping motor from 180 degrees, so as to reach the second excitation phase from the first excitation phase, and the excitation phase being shifted in the reverse rotation direction of the rotor by m steps of the microstep drive of the stepping motor so as to reach the third excitation phase from the second excitation phase;

a third step in which the stepping motor is subjected to the full step drive in a positive or reverse rotation direction of the rotor in a given range of the excitation phase between the third excitation phase and a fourth excitation phase and it is judged whether or not the rotor rotates during the full step drive, the excitation phase being shifted in the positive rotation direction of the rotor by one step of the full step drive of the stepping motor so as to reach the fourth excitation phase from the first excitation phase, a rotation of the rotor in the positive rotation direction thereof causing the driven member to rotate in a positive rotation direction thereof; and a fourth step in which if the rotor is judged rotating in the third step, a fifth excitation phase shifted by 180 degrees from the third excitation phase is determined to be the initial excitation phase and stored in a storage means, wherein if the rotor is judged not rotating, the third excitation phase is shifted by m steps of the microstep drive of the stepping motor in the reverse rotation direction of the rotor and the second step and the third step are repeatedly performed until the rotor is judged rotating in the third step.

2. The method according to claim 1, wherein the third step includes:

a first partial step in which the stepping motor is subjected to a microstep drive in the positive rotation direction of the rotor from the third excitation phase to the first excitation phase; and a second partial step in which the stepping motor is subjected to a full step drive in the positive or reverse rotation direction of the rotor between the first excitation phase and the fourth excitation phase and it is judged whether or not the rotor rotates during the full step drive.

3. A device for detecting an initial excitation phase of a stepping motor, in which at a stop position of a driven member driven by a stepping motor driven with a microstep obtained by dividing one step of a full step drive into m×n, m: integer equal to 1 or more than 1, n: integer equal to 2 or more than 2, a rotation of the driven member in a reverse rotation direction being forcedly stopped by a stopper, an initial excitation phase at which a rotor of the stepping motor is in a stable condition is detected on the basis of whether or not the rotor rotates judged from a pattern of an induced electromotive force generated in an exciting coil in a non-excitation state of the stepping motor during the full step drive, the device comprising:

a rotor rotation judging means for judging whether or not the rotor rotates during the full step drive of the stepping motor;

a first exciting means for subjecting the stepping motor to the full step drive that causes the rotor to rotate in a reverse rotation direction thereof until a first excitation phase is attained at which the rotor is judged not rotating by the rotor rotation judging means, a rotation of the rotor in the reverse rotation direction thereof causing the driven member to rotate in the reverse rotation direction thereof;

a second exciting means for subjecting the stepping motor to the microstep drive in the reverse rotation direction of the rotor from a second excitation phase to a third excitation phase, an excitation phase being shifted in the reverse rotation direction of the rotor by an angle, which is obtained by subtracting two step angles of the full step drive of the stepping motor from 180 degrees, so as to reach the second excitation phase from the first excitation phase, and the excitation phase being shifted in the reverse rotation direction of the rotor by m steps of the microstep drive of the stepping motor so as to reach the third excitation phase from the second excitation phase;

a third exciting means for subjecting the stepping motor to the full step drive in a positive or reverse rotation direction of the rotor in a given range of the excitation phase between the third excitation phase and a fourth excitation phase, the excitation phase being shifted in the positive rotation direction of the rotor by one step of the full step drive of the stepping motor so as to reach the fourth excitation phase from the first excitation phase, a rotation of the rotor in the positive rotation direction thereof causing the driven member to rotate in a positive rotation direction thereof; and an initial excitation phase determining means for determining a fifth excitation phase shifted by 180 degrees from the third excitation phase to be the initial excitation phase when the rotor rotation judging means judges that the rotor rotates during the full step drive of the stepping motor by the third exciting means and for storing the fifth excitation phase in a storage means;

wherein when the rotor rotation judging means judges that the rotor does not rotate during the full step drive of the stepping motor by the third exciting means, the third excitation phase is shifted by m steps of the micro step drive of the stepping motor in the reverse rotation direction of the rotor, the second and third exciting means drives the stepping motor again, and the rotor rotation judging means judges again whether or not the rotor rotates.

4. The device according to claim 3, wherein the third exciting means includes:
a first partial exciting means for subjecting the stepping motor to a microstep drive in the positive rotation direction of the rotor from the third excitation phase to the first excitation phase; and
a second partial exciting means for subjecting the stepping motor to a full step drive in the positive or reverse rotation direction of the rotor between the first excitation phase and the fourth excitation phase.

* * * * *